(12) United States Patent
Yotsuya

(10) Patent No.: US 7,794,545 B2
(45) Date of Patent: Sep. 14, 2010

(54) MASK, FILM FORMING METHOD, LIGHT-EMITTING DEVICE, AND ELECTRONIC APPARATUS

(75) Inventor: Shinichi Yotsuya, Chino (JP)

(73) Assignee: Seiko Epson Corporation, Tokyo (JP)

( * ) Notice: Subject to any disclaimer, the term of this patent is extended or adjusted under 35 U.S.C. 154(b) by 761 days.

(21) Appl. No.: 11/611,467

(22) Filed: Dec. 15, 2006

(65) Prior Publication Data

US 2007/0157879 A1    Jul. 12, 2007

(30) Foreign Application Priority Data

Jan. 11, 2006    (JP)    ............... 2006-004249

(51) Int. Cl.
  *C23C 16/00*    (2006.01)
  *C23F 1/00*    (2006.01)
  *H01L 21/306*    (2006.01)

(52) U.S. Cl. .................. 118/721; 118/720; 156/345.19

(58) Field of Classification Search .................. 118/48, 118/49, 49.1, 49.5, 504, 505, 720, 721; 427/82, 427/96, 99, 282; 428/66, 131, 132, 134, 428/136, 167
See application file for complete search history.

(56) References Cited

U.S. PATENT DOCUMENTS

| 4,049,857 | A | * | 9/1977 | Hammer | ...................... 428/136 |
|---|---|---|---|---|---|
| 4,256,532 | A | * | 3/1981 | Magdo et al. | ................... 216/2 |
| 4,328,298 | A | * | 5/1982 | Nester | ............................. 430/5 |
| 5,154,797 | A | * | 10/1992 | Blomquist et al. | ............ 216/12 |
| 7,033,665 | B2 | | 4/2006 | Yotsuya et al. | |
| 2003/0221613 | A1 | * | 12/2003 | Kang et al. | ................ 118/504 |

FOREIGN PATENT DOCUMENTS

| JP | A-08-315981 | 11/1996 |
|---|---|---|
| JP | A-10-298738 | 11/1998 |
| JP | A-10-330911 | 12/1998 |
| JP | A-11-189862 | 7/1999 |
| JP | A-2002-47560 | 2/2002 |
| JP | A-2003-347047 | 12/2003 |
| JP | A-2004-225071 | 8/2004 |

* cited by examiner

Primary Examiner—Parviz Hassanzadeh
Assistant Examiner—Tiffany Nuckols
(74) Attorney, Agent, or Firm—Oliff & Berridge, PLC

(57) ABSTRACT

Provided is a mask which is used to form on the surface of a substrate a plurality of linear film members disposed in parallel to each other by fixing one surface of the mask to the substrate and supplying a film material through the other surface of the mask by the use of a vapor process. The mask includes: a mask body having a plurality of openings corresponding to patterns of the linear film members; and reinforcement ribs which are disposed to cross the openings and which have a function of preventing deformation of the mask body due to the weight thereof. Here, the reinforcement ribs are disposed close to the other surface of the mask in the thickness direction of the openings.

15 Claims, 10 Drawing Sheets

MASK, FILM FORMING METHOD, LIGHT-EMITTING DEVICE, AND ELECTRONIC APPARATUS

BACKGROUND

1. Technical Field

The present invention relates to a mask, a film forming method, a light-emitting device, and an electronic apparatus.

2. Related Art

An organic EL element has a configuration in which a light-emitting layer including at least a fluorescent organic compound (light-emitting material) is disposed between a negative electrode and a positive electrode. The organic EL element generates excitons by injecting electrons and holes into the light-emitting layer, the electrons and the holes are then recombined, and light (fluorescence/phosphorescence) is emitted when the exciton activity decreases.

The organic EL element has characteristics that it can perform surface emission with a high brightness in the range of 100 to 100,000 cd/m$^2$ at a low voltage of 10V or less and that it can emit blue to red light in accordance with the light-emitting material used. The organic EL element has attracted attention as an element to be provided in a display device (light-emitting device) which can realize a large-area full color display at low cost.

An example of such a light-emitting device is a passive matrix light-emitting device shown, for example, in JP-A-8-315981. In the passive matrix light-emitting device, a plurality of positive electrodes and negative electrodes having a linear shape are disposed opposite to each other in a matrix and organic semiconductor layers are individually disposed between the electrodes so as to correspond to positions where the electrodes intersect each other. By controlling switching between ON and OFF states of the electrodes intersecting each other, the organic semiconductor layers individually disposed can be allowed to independently emit light, thereby realizing the full color display.

Here, in the light-emitting device, the negative electrodes, the organic semiconductor layers, and the negative electrodes are generally stacked in this order. The linear negative electrodes are formed by defining insulating partition walls disposed on a substrate before forming the negative electrodes.

The partition walls are mainly formed of a photosensitive resin material and contain moisture or the like due to a photolithography method used to form the partition walls. Accordingly, there is a problem that the organic semiconductor layers reform and deteriorate due to the moisture or the like with the lapse of time and characteristics of the organic EL element such as emission efficiency deteriorate.

A method of forming a negative electrode by the use of a vapor deposition method such as a vacuum deposition method using a shadow mask (hereinafter, simply referred to as "mask") having an opening corresponding to the shape of a linear negative electrode without forming the above-mentioned partition walls is known as a method for solving such a problem.

When the mask having an opening corresponding to the shape of the negative electrode is formed, a warp or a twist is formed in the opening due to a decrease in the rigidity of a mask substrate. Accordingly, the negative electrode formed using the mask also has a warp or a twist, the shape of which is similar to that of the opening. As a result, the characteristics such as the emission efficiency of the organic EL elements of a light-emitting device are not uniform.

Such a problem occurs similarly, for example, when a plurality of narrow metal interconnections arranged in parallel to each other are formed in a bundle using a vapor deposition method.

SUMMARY

An advantage of the present invention is that it provides a mask which is used in a vapor deposition method and which can form a linear member such as a negative electrode with high dimensional precision, a film forming method of forming a linear member using the mask, and a light-emitting device and an electronic apparatus with excellent characteristics the linear member of which is formed by the film forming method.

The advantage is achieved by the following configurations.

According to an aspect of the invention, there is provided a mask which is used to form on the surface of a substrate a plurality of linear film members disposed in parallel to each other by fixing one surface of the mask to the substrate and supplying a film material through the other surface of the mask by the use of a vapor process. Here, the mask includes: a mask body having a plurality of openings corresponding to patterns of the linear film members; and reinforcement ribs which are disposed to cross the openings and which have a function of preventing deformation of the mask body due to the weight thereof. The reinforcement ribs are disposed close to the other surface of the mask in the thickness direction of the openings.

Accordingly, it is possible to provide a mask which is used in a vapor deposition method and which can form a linear member such as a negative electrode with high dimensional precision.

In the mask according to the aspect of the invention, the mask body and the reinforcement ribs may be formed in a body.

Accordingly, it is possible to form the mask body and the reinforcement ribs in a bundle and to form a mask with high dimensional precision. That is, it is possible to reduce the number of processes at the time of forming the mask and to surely obtain a mask with high dimensional precision.

The mask according to the aspect of the invention may be formed of silicon as a major component.

Accordingly, it is possible to relatively easily form the mask.

In the mask according to the aspect of the invention, a metal layer may be formed on the one surface of the mask.

According to the mask having the configuration, when the mask is mounted on the substrate, it is possible to enhance the adhesion of the mask to the substrate by applying a magnetic field to the mask and the substrate. Accordingly, it is possible to satisfactorily prevent a space (gap) from being formed between the mask and the substrate due to the weight of the mask body.

In the mask according to the aspect of the invention, the metal layer may be formed using an electroless plating method.

By using the electroless plating method, it is possible to relatively easily form the metal layer having a uniform thickness on the mask body.

In the mask according to the aspect of the invention, the metal layer may be formed of at least one of cobalt, iron, and nickel as a major component.

By forming the metal layer out of the material, it is possible to mount (attach) the mask to the substrate with high adhesion. By using the electroless plating method, it is possible to relatively easily form the metal layer having a uniform thickness.

In the mask according to the aspect of the invention, the reinforcement ribs may be disposed in the longitudinal direction of the openings at an almost constant interval.

Accordingly, since the strength of the partition walls is uniformly enhanced in the longitudinal direction thereof, it is possible to satisfactorily prevent warp or twist from occurring in the portions of the partition walls.

In the mask according to the aspect of the invention, the openings may have an enlarged width portion in a middle portion in the longitudinal direction, and the reinforcement ribs may be disposed in the enlarged width portions.

Accordingly, it is possible to surely prevent occurrence of breaks in the linear film members to be formed and to makes the thickness uniform.

In the mask according to the aspect of the invention, the reinforcement ribs may have an almost constant width from the one surface of the mask to the other surface of the mask.

Accordingly, it is possible to surely prevent occurrence of breaks in the linear film members to be formed.

In the mask according to the aspect of the invention, the reinforcement ribs may have a portion of which the width increases from the one surface of the mask to the other surface of the mask.

Accordingly, it is possible to surely prevent occurrence of breaks in the linear film members to be formed and to makes the thickness uniform.

According to another aspect of the invention, there is provided a film forming method comprising: mounting the mask according to Claim 1 on the substrate which is disposed opposite to a film material source for supplying the film material and which is held by a substrate holder disposed to be rotatable; and forming the linear film members by displacing the substrate at least once between a first position where the distance between the film material source and the substrate is largest and a second position which is symmetric to the first position about a rotation axis of the substrate holder and allowing the film material supplied from the film material source to pass through the openings. Here, when the distance between the rotation axis of the substrate holder and the film material source is A cm, the distance between the mask and the opening of the film material source is B cm, the largest length of the reinforcement beam in the longitudinal direction of the openings is p μm, and the distance between the substrate and the reinforcement ribs is r μm, a relation of $p/r < 2A/B$ is satisfied.

By satisfying the relation, the film material can surely go around the reinforcement ribs, thereby satisfactorily forming the linear film members without breaks on the surface of the substrate.

In the film forming method according to the aspect of the invention, the displacement of the substrate between the first position and the second position may be performed by allowing the substrate holder to rotate.

Accordingly, by displacing the substrate between the first position and the second position, it is possible to surely form the linear film members without breaks on the surface of the substrate.

In the film forming method according to the aspect of the invention, the rotation of the substrate may be performed continuously or intermittently.

Accordingly, by displacing the substrate between the first position and the second position, it is possible to surely form the linear film members without breaks on the surface of the substrate.

According to another aspect of the invention, there is provided a light-emitting device having the linear film members formed using the film forming method according to the aspect of the invention.

Accordingly, it is possible to provide a light-emitting device having the linear film members without breaks.

In the light-emitting device according to the aspect of the invention, the linear film members may be negative electrodes.

Accordingly, it is possible to provide a light-emitting device having the negative electrodes without breaks.

According to another aspect of the invention, there is provided an electronic apparatus having the light-emitting device according to the aspect of the invention.

Accordingly, it is possible to provide an electronic apparatus with high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a mask, a film forming method, a light-emitting device, and an electronic apparatus according to exemplary embodiments of the present invention will be described in detail with reference to the attached drawings.

Mask

First, a mask according to an embodiment of the invention will be described.

First Embodiment

A mask according to a first embodiment of the invention will be described.

Figure 1:
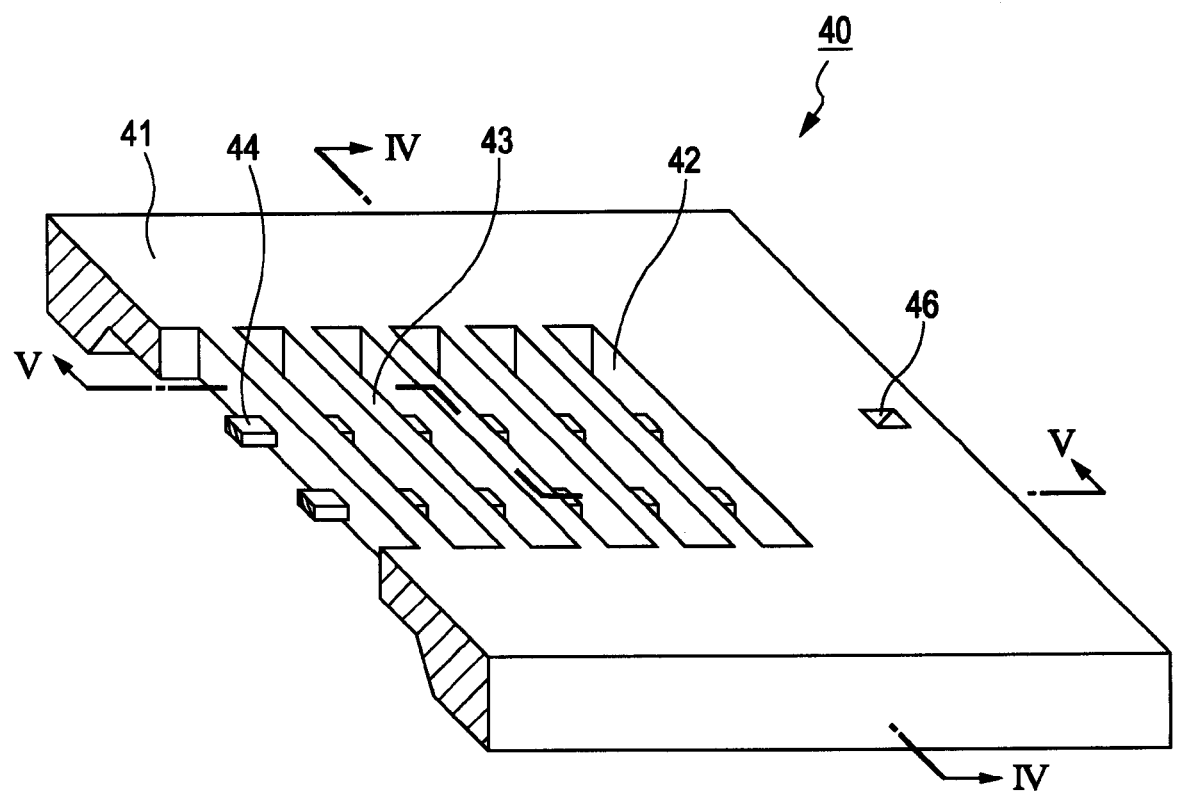
FIG. 1 is a perspective view illustrating a mask according to a first embodiment of the present invention.
Figure 2:
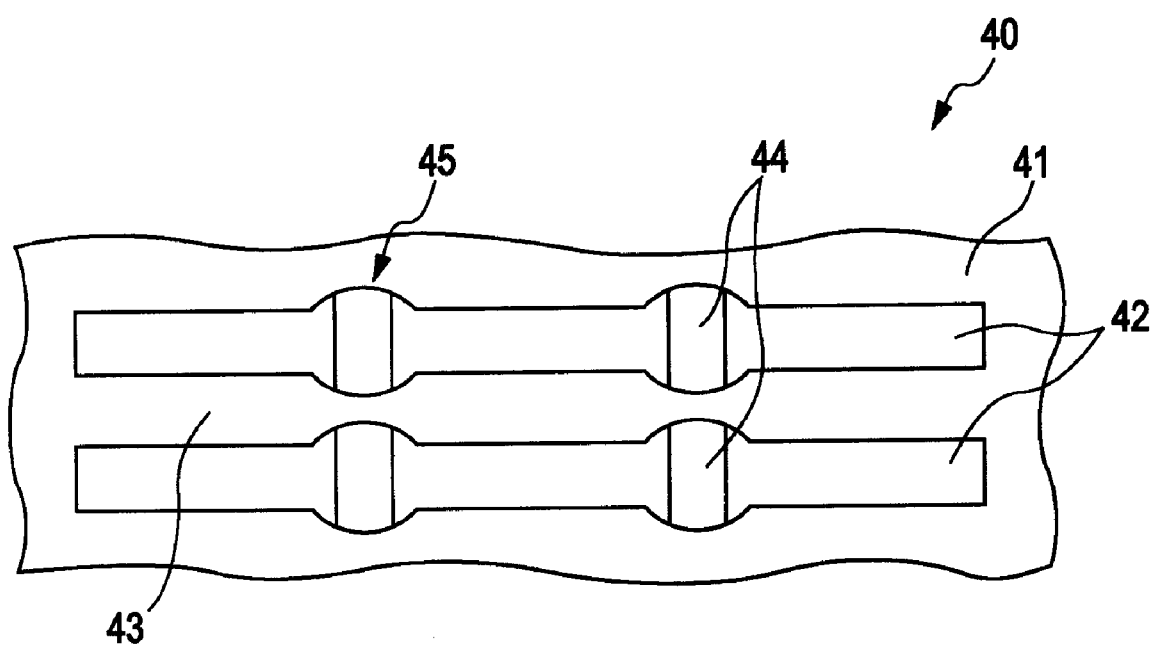
FIG. 2 is a plan view illustrating another configuration of openings.
Figure 3:
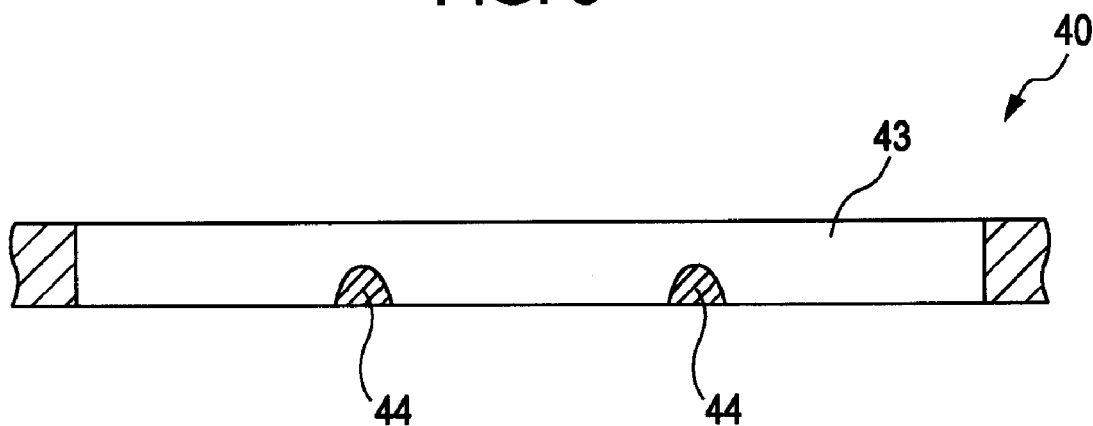
FIG. 3 is a longitudinal sectional view illustrating another configuration of reinforcement ribs.

FIG. 1 is a perspective view illustrating a mask according to a first embodiment of the present invention, FIG. 2 is a plan view illustrating another configuration of openings, and FIG. 3 is a longitudinal sectional view illustrating another configuration of reinforcement ribs. In the following description, the upper side in FIGS. 1 and 3 is referred to as a "top" side and the lower side is referred to as a "bottom" side.

The mask according to the first embodiment of the invention is used to form on the surface of a substrate a plurality of linear film members disposed almost parallel to each other by fixing one surface thereof to the substrate and supplying a film material through the other surface by the use of a vapor deposition process such as a physical vapor deposition (PVD) method, for example, a vacuum deposition method, a sputtering method, and an ion plating method, or a chemical vapor deposition (CVD) method.

The mask 40 includes a mask body 41 and reinforcement ribs 44.

As shown in FIG. 1, a plurality of openings 42 corresponding to patterns (shapes) of linear film members to be formed are formed in the mask body 41.

In this embodiment, the openings 42 are formed in a straight line and are rectangular with a small width in plan view, and are disposed almost parallel to each other with a constant interval. Accordingly, the openings 42 are partitioned by partition walls 43 having a thin plate shape.

Here, in the mask according to the invention, the reinforcement ribs 44 are disposed so as to cross the openings 42. Accordingly, when the mask 40 is mounted on the substrate, the formation of a warp or a twist is prevented in the thin-plate partition walls 43 (mask body 41) due to the weight of the mask, that is, the deformation of the partition walls 43 is prevented. As a result, since the deformation of the openings 42 can be prevented, the linear film members are formed with high dimensional precision using the mask 40.

In the mask according to the invention, each of the reinforcement ribs 44 has a thickness smaller than the height of the openings 42 and when one surface of the mask 40 is fixed to the substrate, the reinforcement ribs are disposed to be disposed close to the other surface of the mask 40. That is, a space is provided between the reinforcement ribs 44 and the substrate.

By forming the reinforcement ribs 44 in such a configuration (which is disposed in the openings 42), it is possible to form the linear film members to be formed continuously without breaks when the linear film members are formed on the substrate using the mask 40.

That is, by separating the reinforcement ribs 44 from the surface on which the linear films are formed, the film material can be incident obliquely on the surface and go around the reinforcement ribs when the film material used to form the linear film members using a vapor deposition method passes through the openings 42 from the other surface side to be deposited on the surface. Accordingly, it is possible to continuously form the linear film members without breaks. The method of forming the linear film members (film forming conditions) will be described in detail later.

The number and the positions of the reinforcement ribs 44 can be arbitrarily set to prevent the deformation of the partition walls 43 which is dependent on the strength of the partition walls 43, but when a plurality of reinforcement ribs 44 are disposed as in this embodiment, the reinforcement ribs 44 are preferably disposed so that the longitudinal direction thereof is perpendicular to the longitudinal direction of the openings 42 and so that there is an almost constant interval between the reinforcement ribs 44. Accordingly, since the strength of the partition walls 43 is enhanced in the longitudinal direction by a uniform magnitude, it is possible to satisfactorily prevent the formation of a warp or a twist in the partition walls 43.

In this embodiment, the mask body 41 and the reinforcement ribs 44 are formed in a body. According to this configuration, it is possible to form the mask body 41 and the reinforcement ribs 44 in a bundle by the use of the method of forming a mask to be described later and to form the mask 40 with high dimensional precision. That is, it is possible to reduce the number of processes at the time of forming the mask 40 and to surely obtain the mask 40 with high dimensional precision.

As described in this embodiment, the openings 42 have a constant width in the longitudinal direction of the openings 42, or may have a configuration that an enlarged width portion 45 of which the width is enlarged is formed in the middle portions in the longitudinal direction of the openings 42 as shown in FIG. 2 and the reinforcement ribs 44 are disposed in the enlarged width portions 45.

By forming the openings 42 in such a configuration, it is possible to supply (deposit) the film material to areas corresponding to the reinforcement ribs 44 on the surface of the substrate. That is, the thickness of the linear film members in the areas may be decreased depending on the distance between the reinforcement ribs 44 and the substrate, but by disposing the enlarged width portions 45 to correspond to the reinforcement ribs 44, it is possible to allow passage of the film material around the reinforcement ribs 44 disposed in the enlarged width portions 45. As a result, drawbacks resulting from forming the reinforcement ribs 44 can be overcome and the film material can be surely supplied to the areas. Accordingly, it is possible to satisfactorily prevent breaks from occurring in the linear film members to be formed and to make the thickness uniform.

The reinforcement ribs 44 may have an almost constant width (length of the reinforcement ribs 44 in the longitudinal direction of the openings 42) as described in this embodiment. Alternatively, for example as shown in FIG. 3, the reinforcement ribs may have a semi-circular shape of which the width gradually increases from one surface to the other. That is, the reinforcement ribs may have a portion in which the width gradually increases from one surface to the other. By constructing the reinforcement ribs 44 in such a configuration, that is, in a tapered shape, it is possible to reduce the amount of film material attached to the reinforcement ribs 44 among the film material supplied obliquely from the peripheries of the reinforcement ribs 44. As a result, by constructing the reinforcement ribs 44 in the above-mentioned configuration, it is possible to obtain the same advantages as described above. The longitudinal section of the reinforcement ribs 44 disposed along the longitudinal direction of the openings 42 may have a semi-circular shape shown in FIG. 3, or may have a trapezoid shape, a triangular shape, a hexagonal shape, or a circular shape.

The configurations of the openings 42 and the reinforcement ribs 44 can be combined with two or more configurations. Accordingly, it is possible to obtain the above-mentioned advantages to a greater degree.

In this embodiment, a mask positioning mark 46 for positioning the mask 40 at the time of using the mask 40 is formed in the peripheral edge of the mask body 41. The mask positioning mark 46 can be formed by removing a part of the mask body 41 by the use of a crystalline anisotropic etching method, or may be formed of a metal film such as chromium.

The mask 40 can be formed of a variety of materials, an example thereof being a glass material such as silicon or quartz glass, silicon being preferable. Accordingly, it is possible to relatively easily form the mask 40 having the above-mentioned configuration.

Now, a method of forming the mask 40 will be described with reference to the case where the mask 40 is formed of silicon as a major component.

FIGS. 4A to 4I and FIGS. 5A to 5I are diagrams illustrating the method of forming a mask shown in FIG. 1. FIGS. 4A to 4I are longitudinal sectional views taken along Line IV-IV of FIG. 1. FIGS. 5A to 5I are longitudinal sectional views taken along Line V-V of FIG. 1. In the following description, the upper side in FIGS. 4A to 4I and FIGS. 5A to 5I is referred to as a top side and the lower side is referred to as a bottom side.

1A

First, a mask substrate 50 formed of mono-crystalline silicon is prepared and then a dry-etching-resistant film 51 formed of a dry-etching-resistant mask material is formed on the entire outer surface of the mask substrate 50.

The thickness of the mask substrate 50 is not particularly limited, but is preferably in the range of 0.01 to 1.0 mm and more preferably in the range of 0.02 to 0.2 mm.

The dry-etching-resistant mask material should have a resistance to dry etching to be described later, and although not particularly limited, examples thereof include silicon dioxide ($SiO_2$), silicon nitride, silicon carbide, aluminum, and chromium.

A variety of film forming methods can be used as the method of forming the dry-etching-resistant film 51. For example, when silicon dioxide is used as the dry-etching-resistant mask material, a steam thermal oxidation method of placing the mask substrate 50 in steam at a temperature in the range of 800 to 1200° C. can be suitably used. When silicon nitride and silicon carbide are used as the dry-etching-resistant mask material, a chemical vapor deposition (CVD) method can be suitably used. When aluminum and chromium are used as the dry-etching-resistant mask material, a physical vapor deposition (PVD) method such as a vacuum deposition method and a sputtering method or a plating method can be suitably used.

The thickness of the dry-etching-resistant film 51 is not particularly limited, but is preferably about 1 µm.

2A

Figure 4A:
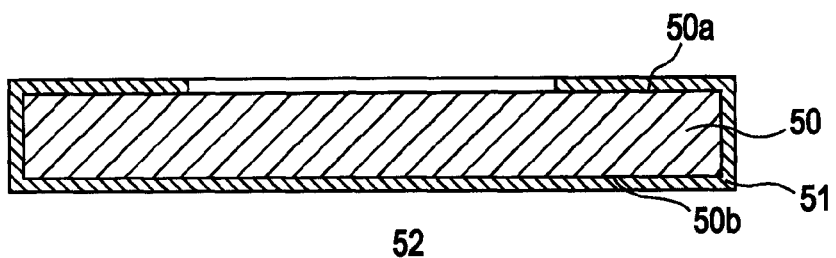
FIGS. 4A to 4I are longitudinal sectional views illustrating a method of forming the mask shown in FIG. 1.
Figure 5A:
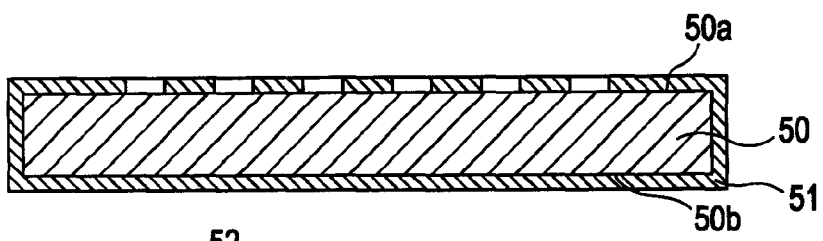
FIGS. 5A to 5I are longitudinal sectional views illustrating a method of forming the mask shown in FIG. 1.

As shown in FIGS. 4A and 5A, the dry-etching-resistant film 51 of the areas corresponding to the openings 42 to be formed is removed from the surface 50a contacting the substrate when the mask 40 is mounted on the substrate, thereby exposing the surface of the mask substrate 50.

Specifically, by forming a resist layer having openings in the areas corresponding to the openings 42 of the surface 50a using photolithography and removing the dry-etching-resistant film 51 exposed from the openings by the use of a wet etching method using an acid etchant such as a fluorine buffer solution, it is possible to expose the surface of the mask substrate 50 from the areas corresponding to the openings 42 to be formed.

When the enlarged width portions 45 are formed in the openings 42 as shown in FIG. 2, the surface of the mask substrate 50 can be exposed to correspond to the shapes.

3A

Figure 4B:
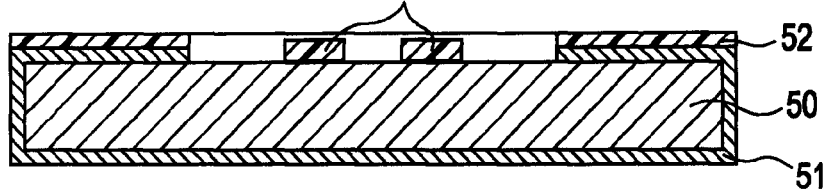
Figure 5B:
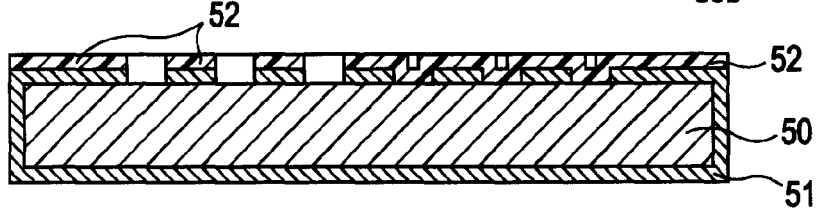

As shown in FIGS. 4B and 5B, a resist layer 52 is formed in areas for the reinforcement ribs 44 in the areas where the surface of the mask substrate 50 is exposed in process 2A by using the photolithography.

Accordingly, the surface of the mask substrate 50 is exposed from the areas where the reinforcement ribs 44 are not formed, among the areas for the openings 42.

The resist layer 52 can be formed of a variety of photosensitive resin materials and examples thereof include water-soluble photoresists such as rhodine-dichromate salt, polyvinyl alcohol (PVA)-dichromate salt, shellac-dichromate salt, casein-dichromate salt, PVA-diazo, and an acrylic photoresist, and oil-soluble photoresists such as polycinnamate vinyl, cyclized rubber-azid, polyvinyl cinnamylidene acetate, and polycinnamate β-vinyl oxyethyl ester.

As shown in FIG. 3, when the longitudinal section of the reinforcement ribs 44 in the longitudinal direction of the openings 42 is semi-circular, the resist layer 52 can be formed to correspond to the shape of the reinforcement ribs 44 to be formed. The semi-circular resist layer 52 can be obtained by post-baking the quadrangular resist layer 52 formed in this process at 150 to 200° C. to form a semi-solid state and then re-solidifying the semi-solid resist layer.

4A

Figure 4C:
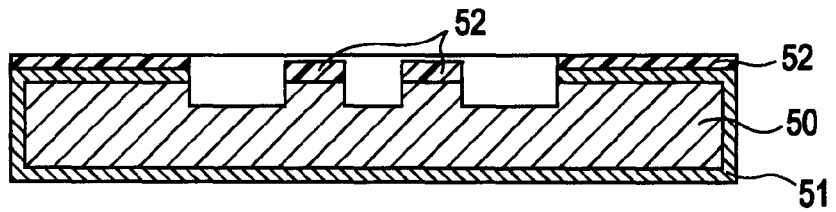
Figure 5C:
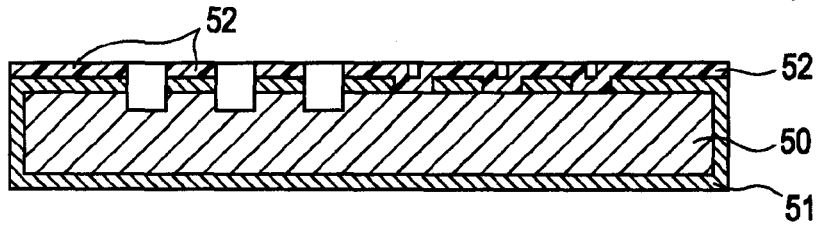

As shown in FIGS. 4C and 5C, the mask substrate (silicon) 50 in the areas where the surface of the mask substrate 50 is exposed, that is, in the areas in which the reinforcement ribs 44 are not formed among the areas where the openings 42 are formed, is removed to a predetermined depth.

An anisotropic etching method for removing silicon in a specific direction, that is, in the direction almost parallel to the thickness direction of the mask substrate 50 in this embodiment, is suitably used to remove silicon.

Examples of the anisotropic etching can include anisotropic wet etching or anisotropic dry etching such as reactive ion etching (RIE), reactive ion beam etching (RIBE), and fast atom beam (FAB) etching. The reactive ion etching is suitably used in that it is excellent in directional selectivity and productivity.

5A

Figure 4D:
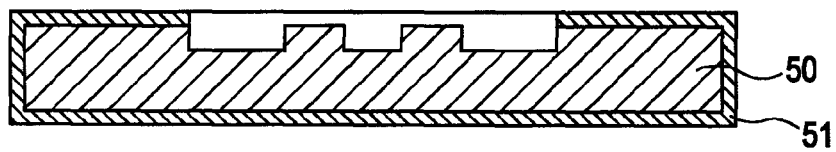
Figure 5D:
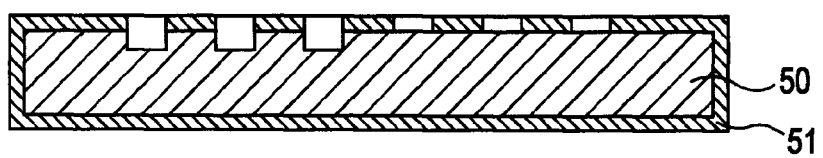

As shown in FIGS. 4D and 5D, the resist layer 52 is removed (peeled off). Accordingly, the surface of the mask substrate 50 is exposed from the areas where the openings 42 are formed.

The method of removing the resist layer 52 can be properly selected in accordance with the kind of resist layer 52 used and can be performed by the use of ashing under the atmospheric pressure of oxygen plasma or ozone or under a depressurized pressure, irradiation of UV rays, irradiation of various laser beams such as Ne—He laser beams, Ar laser beams, $CO_2$ laser beams, ruby laser beams, semiconductor laser beams, YAG laser beams, glass laser beams, YVO4 laser beams, and excimer laser beams, and contact with (for example, immersion in) a solvent which can dissolve or decompose the resist layer 52.

6A

Figure 4E:
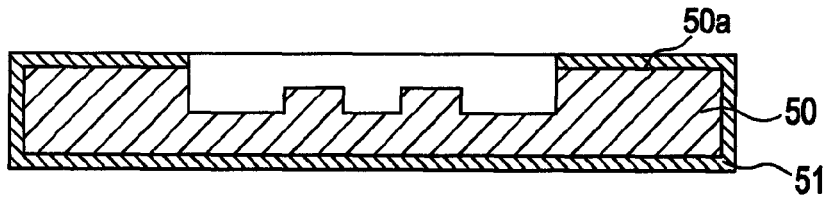
Figure 5E:
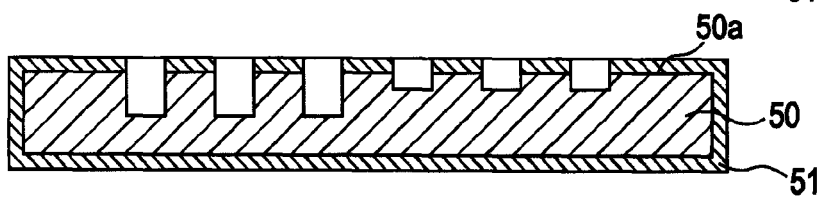

As shown in FIGS. 4E and 5E, similarly to the description in the process 4A, the mask substrate (silicon) 50 in the areas where the surface of the mask substrate 50 is exposed, that is, in the areas where the openings 42 are formed, is uniformly removed to a predetermined depth.

Accordingly, in the areas from which silicon is removed in the process 4A (where the reinforcement ribs 44 are not formed), silicon is removed deeper and more uniformly in the thickness direction of the mask substrate 50. In the areas where the resist layer 52 is removed and the reinforcement ribs 44 are formed, silicon is removed uniformly.

That is, silicon is removed uniformly from the areas where the openings 42 are formed, in the state that the difference in depth from the surface of the mask substrate 50 between the areas where the reinforcement ribs 44 are formed in the process 4A and the areas where the reinforcement ribs 44 are not formed is maintained. Accordingly, as shown in FIGS. 4E and 5E, two-stepped unevenness is formed in the mask substrate 50.

The areas from which silicon is newly removed in the process 6A are areas where the reinforcement ribs 44 are formed and silicon is removed to a predetermined depth from the surface 50a. Accordingly, the depth of the mask substrate 50 removed by the anisotropic etching is equal to the distance from the substrate to the reinforcement ribs 44 when the mask 40 is mounted on the substrate. The depth is preferably in the range of 5 to 200 μm and more preferably in the range of 10 to 100 μm. When the depth is less than the lower limit, it is difficult for the film material to go around the reinforcement ribs 44 and thus the linear film members to be formed may be broken. When the depth is more than the upper limit, the distance between the substrate and the reinforcement ribs 44 is unnecessarily greater and the film material may not reach the substrate.

7A

Figure 4F:
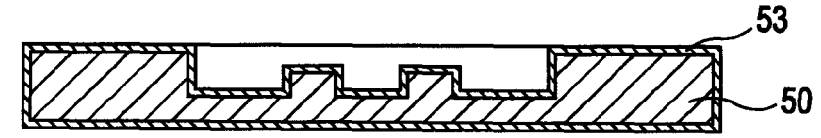
Figure 5F:
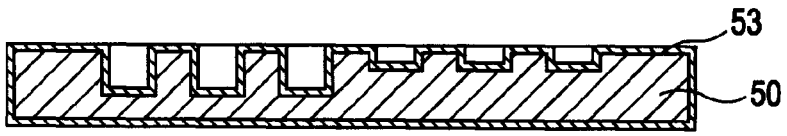

Next, the dry-etching-resistant film 51 formed on the outer surface of the mask substrate 50 is removed (peeled off) and then as shown in FIGS. 4F and 5F, a wet-etching-resistant film 53 is formed on the entire outer surface of the mask substrate 50.

The dry-etching-resistant film 51 can be removed by the use of the acid wet etching using acid etchant such as fluorine buffer solution described in the process 2A.

The wet-etching-resistant film 53 can be formed similarly to the dry-etching-resistant film 51 described in the process 1A.

8A

Figure 4G:
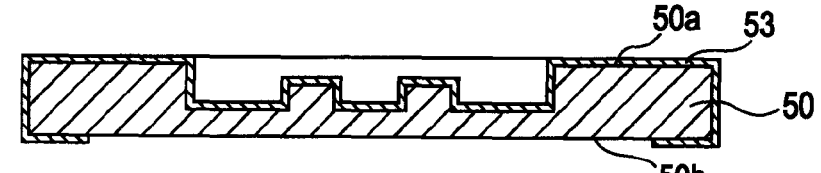
Figure 5G:
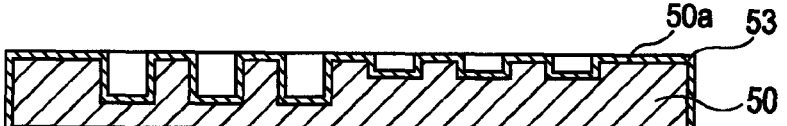

As shown in FIGS. 4G and 5G, the wet-etching-resistant film 53 formed on the surface 50b opposite to the surface 50a is removed from the areas other than the outer peripheral portion of the mask substrate 50, thereby exposing the surface of the mask substrate 50.

As the method of removing the wet-etching-resistant film 53 from the areas other than the outer peripheral portion of the mask substrate 50, a method of forming a resist layer having openings corresponding to the areas using photolithography and then removing the wet-etching-resistant film 53 exposed from the openings using the acid wet etching described in the process 2A can be used.

9A

Figure 4H:
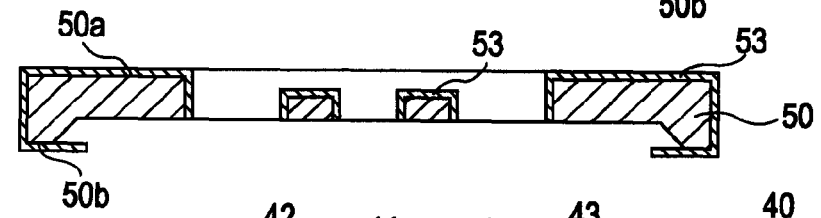
Figure 5H:
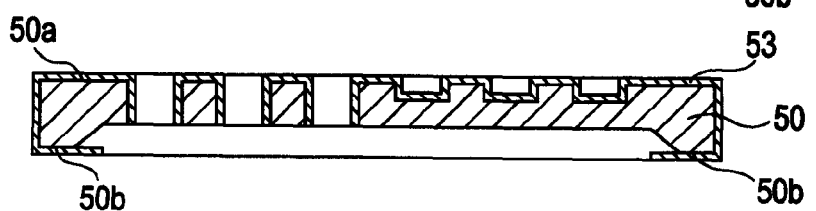

As shown in FIGS. 4H and 5H, the mask substrate (silicon) 50 exposed from the wet-etching-resistant film 53 is removed uniformly to a predetermined depth from the surface 50b in the thickness direction of the mask substrate 50.

Accordingly, in the areas where the reinforcement ribs 44 are not formed among the areas where the openings 42 are formed, a space is formed from the surface 50a to the surface 50b so that they may communicate with each other.

Silicon can be removed by anisotropic wet etching using an aqueous solution of alkali metal such as NaOH and KOH, an aqueous solution of alkali earth metal hydroxide such as $Mg(OH)_2$, an aqueous solution of tetramethyl ammonium hydroxide, or an amid organic solvent such as N,N-dimethyl formaldehyde (DMF) and N,N-dimethyl acetamide (DMA) as wet etchant. Accordingly, it is possible to remove silicon at a uniform rate without forming surface roughness for a relatively short time.

The removal of silicon is not limited to performing the anisotropic wet etching, but may be performed using the anisotropic dry etching described above.

Silicon is removed from the surface 50b of the mask substrate 50 for the purpose of minimizing the thickness of the mask 40. The outer peripheral portion of the mask substrate 50 is formed so as to be thick for the purpose of securing the strength of the mask 40.

10A

Figure 4I:
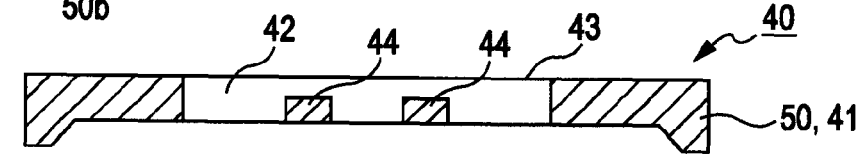
Figure 5I:
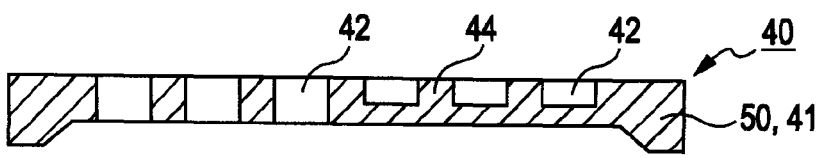

As shown in FIGS. 4I and 5I, the wet-etching-resistant film 53 formed on the outer surface of the mask substrate 50 is removed (peeled off).

As a result, the mask 40 having the openings 42 corresponding to the patterns of the linear film members and the reinforcement ribs 44 crossing the openings 42 are formed.

The removal of the wet-etching-resistant film 53 can be performed by the use of the wet etching using etchant such as fluorine buffer solution described in the process 2A.

Second Embodiment

Next, a mask according to a second embodiment of the invention will be described.

Figure 6:
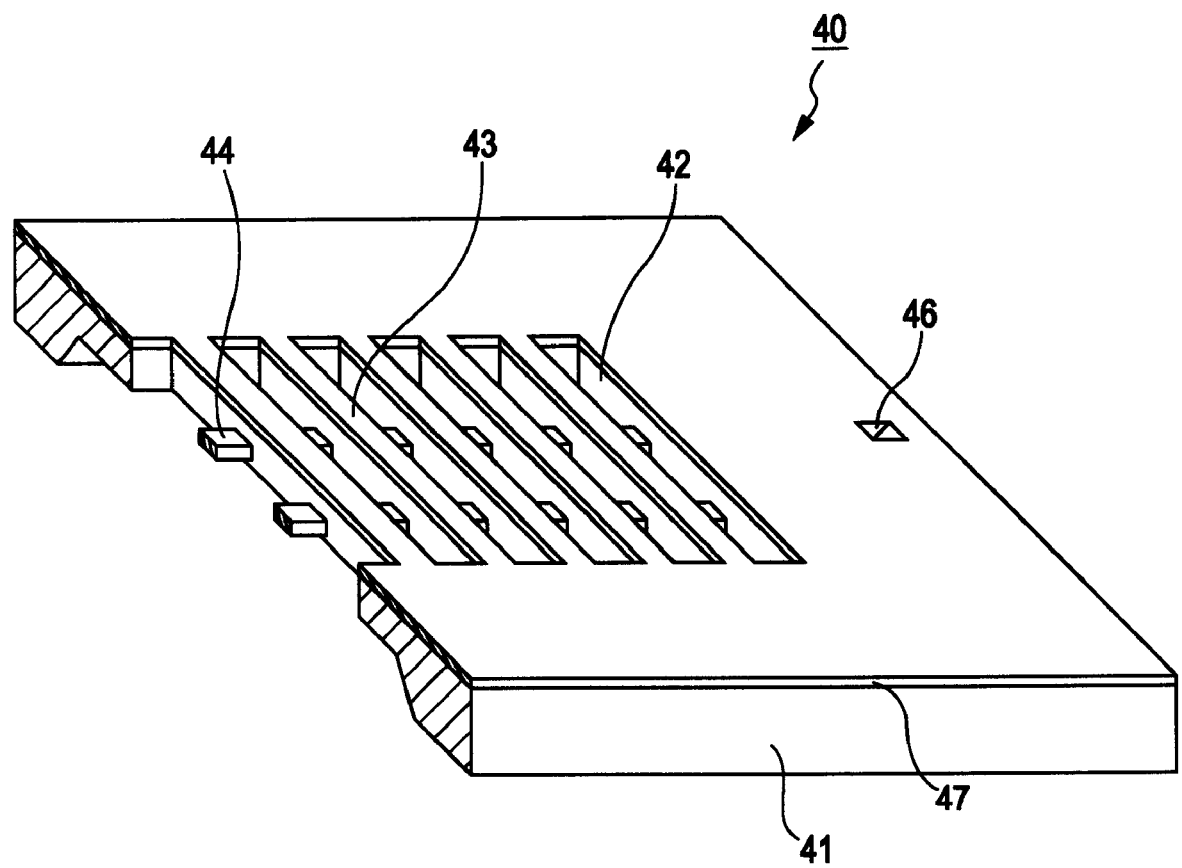
FIG. 6 is a perspective view illustrating a mask according to a second embodiment of the invention.

FIG. 6 is a perspective view illustrating a mask according to the second embodiment of the invention. In the following description, the upper side in FIG. 6 is referred to as a top side and the lower side is referred to as a bottom side.

Differences between the second embodiment and the first embodiment are mainly described and like structures are not described.

The mask 40 shown in FIG. 6 is similar to the mask 40 according to the first embodiment, except that a metal layer 47 is formed on the top surface.

In the second embodiment, as shown in FIG. 6, a metal layer 47 is formed on the top surface, that is, on the surface of the mask body 41 contacting the substrate when the mask 40 is mounted on the substrate. As a result, by applying a magnetic field between the mask 40 and the substrate at the time of mounting the mask 40 on the substrate, it is possible to accomplish the increase in adhesion of the mask 40 to the substrate. Accordingly, it is possible to surely prevent a space (gap) from being formed between the mask 40 and the substrate due to the weight of the mask body 41 (specifically, the partition walls).

The material (metal material) of the metal layer 47 is not particularly limited and examples thereof can include cobalt (Co), iron (Fe), nickel (Ni), and alloys thereof. One or two or more kinds thereof may be combined. Accordingly, it is possible to mount (attach) the mask 40 onto the substrate with high adhesion and to relatively easily form a metal layer having a uniform thickness by the use of an electroless plating method to be described later.

The thickness of the metal layer 47 is not particularly limited, but is preferably in the range of 0.01 to 100 μm and more preferably in the range of 0.1 to 20 μm.

The mask 40 according to this embodiment can be obtained by forming the metal layer 47 on the mask body 41, in comparison with the mask 40 according to the first embodiment.

A variety of methods can be used as the method of forming the metal layer 47 and examples thereof can include an electroless plating method, an electrolysis plating method, a vacuum deposition method, and a sputtering method. Among them, the electroless plating method can be preferably used. It is possible to relatively easily form the metal layer 47 having a uniform thickness on the mask body 41 by the use of the electroless plating method.

Hereinafter, the electroless plating method is described as the method of forming the metal layer 47.

1B

First, the mask 40 obtained in the first embodiment is prepared and an electroless-resistant plating film formed of an electroless plating-resistant material is formed on the entire outer surface of the mask 40.

The electroless plating-resistant film can be formed similarly to the method of forming the dry-etching-resistant film 51 described in the process 1A. By forming the electroless plating-resistant film, it is possible to surely prevent silicon, which is a material of the mask 40, from being dissolved in an electroless plating solution at the time of immersing the mask 40 in the electroless plating solution in the subsequent process 3B.

2B

Next, at the time of mounting the mask 40 on the substrate, an underlying layer is formed on the surface contacting the substrate, that is, on the surface 50a shown in FIGS. 4 and 5.

The material of the underlying layer can be properly selected depending on the kinds of the materials of the metal layer 47 and examples thereof can include Ni, Cu, Au, Pt, and Ag. One or two or more kinds thereof may be combined.

The underlying layer may have a single-layered structure or a multi-layered structure including the above-mentioned materials as a major component.

Specifically, when the metal layer 47 includes Co as a major component, the underlying layer can have properly a multi-layered structure in which a Cr layer and an Au layer are stacked in this order from the surface 50a.

3B

Next, by immersing the mask 40 in the plating solution including metal salt and a deoxidizing agent as major components, metal elements are extracted on the underlying layer, that is, on the surface 50a, thereby forming the metal layer 47.

For example, sulfate salt, nitrate salt, and the like can be properly used as the metal salt.

Examples of the deoxidizing agent can include ammonium phosphinate, sodium phosphinate, and hydrazine and at least one of hydrazine and sodium phosphinate is preferably used as a major component. By using them as the deoxidizing agent, the film forming rate of the metal layer 47 can be proper, thereby relatively easily controlling the thickness of the metal layer 47.

The content of metal salt in the plating solution (an amount of metal salt added to the solvent) is preferably in the range of 0.01 to 0.5 mol/L and more preferably in the range of 0.1 to 0.3 mol/L. When the content of metal salt is too small, it may take long time to form the metal layer 47. On the other hand, when the content of metal salt is more than the upper limit, the better effect cannot be expected.

The content of the deoxidizing agent in the plating solution (an amount of deoxidizing agent added to the solvent) is preferably in the range of 0.05 to 2.0 mol/L and more preferably in the range of 0.5 to 1.0 mol/L. When the content of the deoxidizing agent is too small, it may be difficult to deoxidize metal ions with high efficiency depending on the kinds of the deoxidizing agent. On the other hand, the content of the deoxidizing agent is more than the upper limit, the better effect cannot be expected.

It is preferable that a pH adjuster (pH buffer) is mixed (added) into the plating solution. In this case, it is possible to prevent or suppress pH of the plating solution from decreasing with the advancement of the electroless plating and thus to effectively prevent the film forming rate from decreasing.

A variety of agents can be used as the pH adjuster and at least one of ammonia water, trimethyl ammonium hydride, sodium hydroxide, sodium carbide, and ammonium sulfide is used preferably as a major component thereof. Since these have an excellent buffer ability, the effect can be more remarkably exhibited by using them as the pH adjuster.

The pH of the plating solution is preferably in the range of 8.0 to 13.0 and more preferably in the range of 9.5 to 10.5.

The temperature of the plating solution is preferably in the range of 70 to 95° C. and more preferably in the range of 80 to 85° C.

By setting the pH and the temperature of the plating solution to the above-mentioned ranges, the film forming rate becomes particularly suitable, thereby forming the metal layer 47 having a uniform thickness with high precision.

Film Forming Method

Next, a film forming method of forming linear film members on the surface of the substrate by the use of a vapor deposition method using the mask according to the embodiments of the invention will be described.

Figure 7:
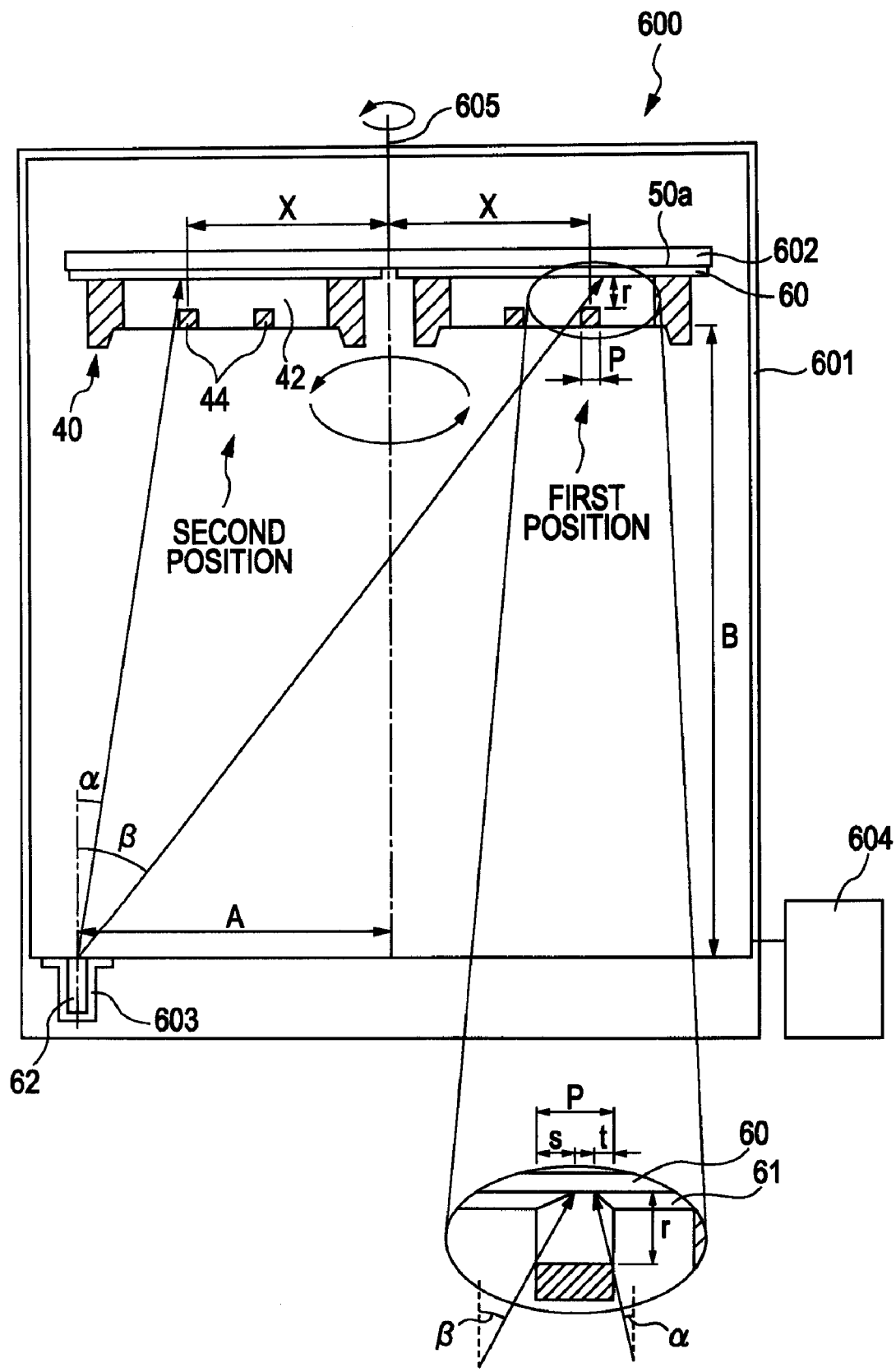
FIG. 7 is a diagram illustrating a film forming method of forming a linear member by the use of a vapor deposition method using the mask according to an embodiment of the invention.

FIG. 7 is a diagram illustrating a film forming method of forming the linear film members by the use of the vapor deposition method using the mask according to the embodiments of the invention.

Examples of the vapor deposition method used to form the linear film members 61 on the surface of the substrate 60 can include a physical vapor deposition (PVD) method such as a vacuum deposition method and a sputtering method and a chemical vapor deposition (CVD) method such as a CVD method. It will be described below as an example that the linear film members 61 are formed using the vacuum deposition method.

A vacuum deposition apparatus 600 shown in FIG. 7 includes a chamber (vacuum chamber) 601, a substrate holder 602 which is disposed in the chamber 601 so as to hold the substrate 60, and a crucible (film material source) 603 which is disposed in the chamber 601 and which vaporizes the film material 62 for forming the linear film members 61 and supplies the vaporized film material to the substrate 60.

An exhaust pump (depressurizing unit) 604 exhausting gas therein to control a pressure is connected to the chamber 601.

The substrate holder 602 is attached to the ceiling of the chamber 601. The substrate holder 602 is fixed to a rotation shaft 605 and the substrate holder 602 can rotate about the rotation shaft 605.

The crucible 603 is disposed at the position opposed to the substrate holder 602, that is, on the bottom of the chamber 601.

The crucible 603 includes a heater (not shown) which heats and vaporizes (evaporates or sublimates) the film material 62 received in the crucible 603.

The heating method of the heater is not particularly limited and examples thereof can include a resistance heating method and an electron beam heating method.

The film material 62 can be properly selected depending on the kinds of the linear film members 61 and is not particularly limited. Examples thereof can include a metal material such as Al, Ni, Cu, Mg, and Ag, a metal oxide material such as MgO and $In_2O_3$, and a metal complex such as copper phthalocyanine and (8-hydroxyquinoline) aluminum ($Alq_3$).

The linear film members 61 are formed as described below using the vacuum deposition apparatus 600 having the above-mentioned structure.

1C

First, the mask 40 is mounted on the substrate 60 in a state where one surface of the mask 40 is directed to the substrate 60. At this time, the reinforcement ribs 44 are located close to the other surface of the mask 40. That is, the surface 50a of the mask 40 comes in contact with the substrate 60.

The substrate 60 mounted with the mask 40 is loaded into the chamber 601 and is arranged (set) to the substrate holder 602 so that the mask 40 is interposed between the substrate 60 and the crucible 603. That is, the substrate 60 mounted with the mask 40 is arranged in the substrate holder 602 so as to oppose the mask 40 and the crucible 603 to each other.

2C

Next, the exhaust pump 604 is allowed to operate to depressurize the inside of the chamber 601.

The degree of depressurization (degree of vacuum) is not particularly limited, but is preferably in the range of $1 \times 10^{-5}$ to $1 \times 10^{-2}$ Pa and more preferably in the range of $1 \times 10^{-4}$ to $1 \times 10^{-3}$ Pa.

3C

Next, the substrate 60 rotates by allowing the rotation shaft 605 to rotate.

Accordingly, the mask 40 can be continuously displaced (arranged) between a first position where the distance between the crucible 603 and the substrate 60 (mask 40) mounted on the substrate holder 602 is largest and a second position where the distance is smallest. The mask 40 located at the first position and the mask 40 located at the second position are symmetric about the rotation shaft 605 (rotation axis of the substrate 60).

The rotation shaft 605 rotates preferably at 1 to 50 rpm and more preferably at 10 to 20 rpm. Accordingly, in the subsequent process 4C, it is possible to form the linear film members 61 having a more uniform thickness.

4C

Next, the film material 62 is vaporized (evaporated or sublimated) by heating the crucible 603 holding the film material 62 while rotating the substrate 60.

Then, as shown in FIG. 7, the vaporized film material 62 passes through the openings 42 of the mask 40 from the other surface side and reaches the surface of the substrate 60, thereby forming the linear film members 61.

Here, as described above, the reinforcement ribs 44 are disposed close to the opposite surface of the substrate 60, that is, opposite to the substrate 60, in the thickness direction of openings 42. Accordingly, the film material 62 can go around the reinforcement ribs 44 at the time of passing through the openings 42. As a result, the film material 62 can be attached to the entire surface of the areas of the substrate 60 corresponding to the openings 42, thereby forming the linear film members 61 without break.

In other words, since a film can be formed without influence of the reinforcement ribs 44 disposed so as to cross the openings 42, it is possible to form the linear film members 61 without any break on the surface of the substrate 60.

As shown in FIG. 7, when the distance between the rotation axis (rotation axis of the substrate 60) 605 of the substrate holder 602 and the center axis of the crucible 603 is A [cm], the distance between the mask 40 and the opening of the crucible 603 is B [cm], the largest length of the reinforcement beam 44 in the longitudinal direction of the openings 42 is p [μm], and the distance between the substrate 60 and the reinforcement ribs 44 is r [μm], the following Expression 1 should be satisfied.

$$p/r < 2A/B \qquad \text{Expression 1}$$

By satisfying the relation, the film material 62 can certainly go around the reinforcement beam 44, thereby surely forming the linear member 61 without a break on the surface of the substrate 60. As a result, for example, when metal wires are formed by the linear film members 61, the increase in resistance value or the occurrence of breaks can be satisfactorily prevented due to the decrease in thickness of the linear film members 61 to be formed.

Here, it can be seen from the following expression that the linear film members 61 can be formed without a break by satisfying Expression 1.

As described above, the linear film members 61 can be formed without a break, because the film material 62 makes a detour around the reinforcement ribs 44.

When the substrate 60 (mask 40) is disposed at the first position, the distance by which the film material 62 makes a detour around the reinforcement ribs 44 is largest. When the substrate 60 (mask 40) is disposed at the second position, the distance is smallest.

Therefore, assumed that the distance by which the film material 62 makes a detour around the reinforcement ribs 44 is s [μm] when the substrate 60 is disposed at the first position and the distance by which the film material 62 makes a detour around the reinforcement beam 44 is t [μm] when the substrate 60 is disposed at the second position, the sum (s+t) of the distances is set so that the maximum length in a direction parallel to the longitudinal direction of the openings 42 of the reinforcement ribs 44 is larger than p, whereby the linear film members 61 can be formed without a break.

That is, by satisfying the relation of Expression 2, the linear film members 61 can be formed without a break. In the enlarged view shown in FIG. 7, it is shown for the purpose of convenient explanation that p is greater than s+t and the linear member 61 is broken.

$$p < s+t \qquad \text{Expression 2}$$

Accordingly, assumed that the incident angle of the film material 62 about the center axis of the crucible 603 is α when the distance by which the film material 62 makes a detour around the reinforcement ribs 44 is t (μm) and the incident angle of the film material 62 about the center axis of the crucible 603 is β when the distance by which the film material 62 makes a detour around the reinforcement ribs 44 is s (μm), Expression 3 is established. Accordingly, by substituting Expression 3 for Expression 2, Expression 4 is obtained.

$$t = r \cdot \tan \alpha, \; s = r \cdot \tan \beta \qquad \text{Expression 3}$$

$$p < r \cdot (\tan \alpha + \tan \beta) \qquad \text{Expression 4}$$

Since Expression 5 is established, Expression 1 can be obtained by substituting Expression 5 for Expression 4.

$$\tan \alpha = (A-X)/B, \; \tan \beta = (A+X)/B \qquad \text{Expression 5}$$

As described above, when the relation of Expression 1 is satisfied, the substrate 60 (mask 40) is displaced between the first position and the second position at least once, whereby the linear film members 61 can be formed without a break. Therefore, as described in this embodiment, the rotation of the substrate 60 is not limited to the continuous rotation, but the substrate 60 may be intermittently displaced between the first position and the second position.

As shown in FIG. 2, when the mask 40 has the enlarged width portions 45 in the openings 42 and includes the reinforcement ribs 44 in the enlarged width portion 45, it is preferable to successively rotate the substrate 60 as described above. Accordingly, when the film material 62 passes through the openings 42, the film material 62 makes a detour around the reinforcement ribs 44 from the enlarged width portion 45, thereby surely forming the linear film members 61 without a break.

By removing (peeling off) the film material formed on the surface opposite to the substrate 60 at the time of forming the linear film members 61, the mask 40 can be reused. Therefore, it is possible to reduce the cost at the time of forming the linear film members 61 by reusing the mask 40.

Light-Emitting Device

Next, a light-emitting device of the invention comprising a linear shaped body formed by the film forming method of the invention will be explained with regard to a passive matrix type display device as an example.

Figure 8:
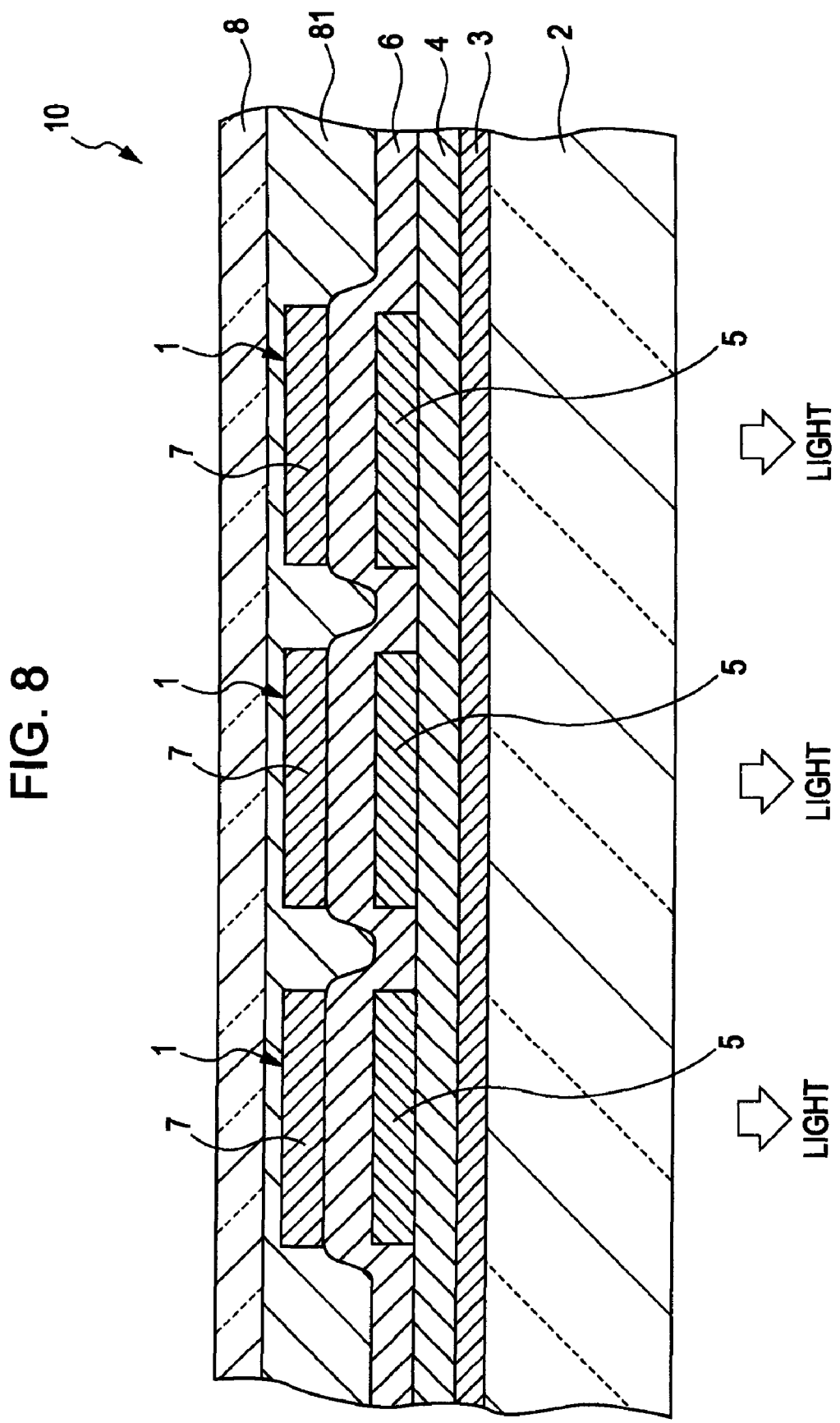
FIG. 8 is a longitudinal sectional view illustrating an example of a passive matrix display device employing a light-emitting device according to an embodiment of the invention.
Figure 9:
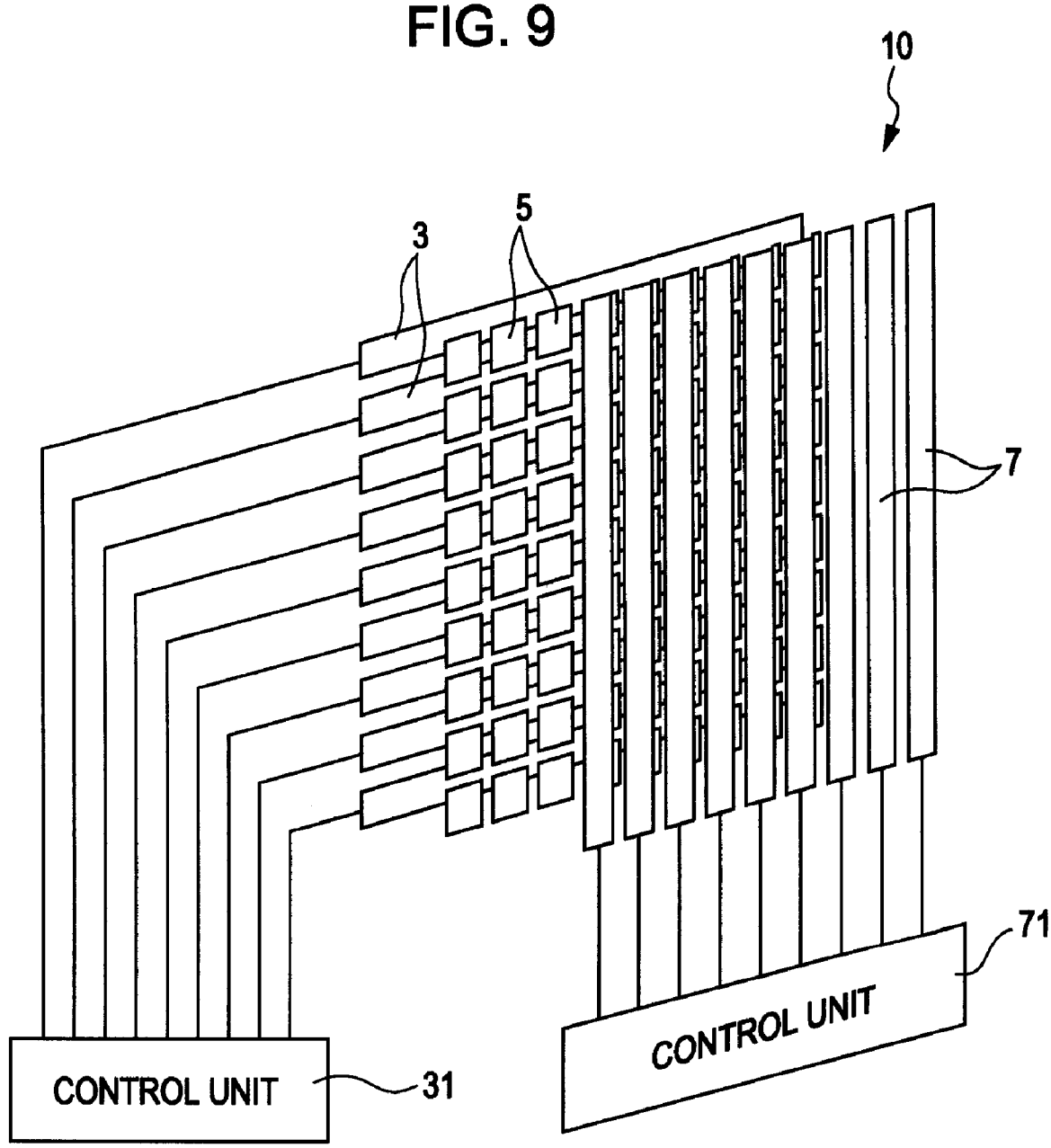
FIG. 9 is a perspective view illustrating an example of a passive matrix display device employing the light-emitting device according to an embodiment of the invention.

FIGS. 8 and 9 show an example of a passive matrix type display device to which a light-emitting device of the invention is applied. FIG. 8 is a longitudinal cross-sectional view and FIG. 9 is a perspective view. For the purpose of convenient explanation, the control circuit is not shown in FIG. 8 and a transparent substrate 2, a hole transport layer 4, an electron transport layer 6, and a sealing member 8 are not shown in FIG. 9. In the following description, the upper side and the lower side in FIG. 8 are referred to as a "top" side and a "bottom" side, respectively.

The passive matrix type display device 10 shown in FIGS. 8 and 9 (hereinafter, simply referred to as "display device") has the transparent substrate 2, a plurality of organic EL elements 1 (organic light-emitting element) provided on the transparent substrate 2, and the sealing member 8 provided opposite to the transparent substrate 2 to seal the each organic EL element 1.

The display device 10 has a control unit 31 and a control unit 71 that control the ON/OFF of a positive electrode 3 and a negative electrode 7 provided in the organic EL element 71.

The transparent substrate 2 becomes a support for each portion that constitutes the display device 10.

Since the display device of this embodiment has a constitution that extracts the light from the transparent substrate 2 side, the transparency is required for the transparent substrate 2.

As the transparent substrate 2, transparent one is selected among various glass substrates and various resin substrates. For example, a substrate mainly comprising glass material such as quartz glass, soda glass, or resin material such as polyethylene terephthalate, polyethylene naphthalate, polypropylene, cycloolefin polymer, polyamide, polyether sulfone, polymethyl methacrylate, polycarbonate, polyarylate.

The average thickness of the transparent substrate 2 is not limited, but preferably in the range of 0.2 to 30 mm, and more preferably in the range of 0.5 to 20 mm.

On the transparent substrate 2, a plurality of organic EL elements 1 (light-emitting element) comprising a pair of electrodes (positive electrode 3 and negative electrode 7), and the hole transport layer 4, the light-emitting layer 5 and electron transport layer 6 provided between the electrodes in this order from the positive electrode 3 side.

In this embodiment, the positive electrode 3 and the negative electrode 7 are linearly (strip shape) provided, respectively, and are arranged opposite to each other so that the electrodes intersect to each other in a matrix shape. Each positive electrode 3 is electrically connected to the control unit 31 and each negative electrode 7 is electrically connected to the control unit 71 via wiring.

The hole transport layer 4 and the electron transport layer 6 of each organic EL element 1 are integrally formed, and the light-emitting layers 5 individually provided so as to correspond to an intersecting area where the positive electrode 3 and the negative electrode 7 intersect to each other.

By constituting the organic EL element 1 as such, the ON/OFF of each positive electrode 3 and each negative electrode 7 can be independently controlled by the control unit 31 and the control unit 71 and a voltage can be applied to the desired intersecting area.

Therefore, each light-emitting layer 5 provided in correspond to the intersecting area can emit light independently. Namely, each organic EL element 1 can emit light independently. The display device 10 comprising the organic EL element 1 may monochromatically display mono color, or display multi colors by selecting the constituent material (light-emitting material) of the light-emitting layer 5 provided individually.

Hereinafter, each portion constituting the organic EL element 1 will be explained.

The positive electrode 3 is an electrode that injects a hole into the hole transport layer 4. Since the display device 10 is a bottom emission structure that extracts the light from the positive electrode 3 side, the material constituting the positive electrode 3 (positive electrode material) has the transparency and is properly selected from conductive materials having large work function.

The positive electrode material may include transparent conductive materials such as indium tin oxide (ITO), fluorine-containing indium tin oxide (FITO), antimony tin oxide (ATO), indium zinc oxide (IZO), aluminum zinc oxide (AZO), tin oxide ($SnO_2$), zinc oxide (ZnO), fluorine-containing tin oxide (FTO), fluorine-containing indium oxide (FIO), and at least one type of them can be used.

The average thickness of the positive electrode 3 is not limited, but preferably in the range of 10 to 300 nm and more preferably in the range of 50 to 200 nm.

The positive electrode 3 has a light transmittance preferably of 60% or more and more preferably 80% or more in the optical wavelength region. Therefore, the light can be efficiently extracted from the positive electrode 3 side.

The negative electrode 7 is an electrode that injects an electron into the electron transport layer 6.

The material constituting the negative electrode 7 (negative electrode material) is properly selected from materials having excellent conductive property and small work function.

Examples of the negative electrode material may include Al, Li, Mg, Ca, Sr, La, Ce, Er, Eu, Sc, Y, Yb, Ag, Cu, Cs, Rb, and alloy containing them and at least one kind of them can be used.

Specifically, in case of using an alloy as the negative electrode material, it is preferable to use an alloy containing stable metal elements such as Ag, Al Cu, concretely an alloy such as MgAg, AlLi, and CuLi. By using such alloy as the negative electrode, electron injection efficiency and stability of the negative electrode 7 can be improved.

The average thickness of the negative electrode 7 is preferably 1 nm to 1 μm, and more preferably 100 to 400 mm.

As described above, the hole transport layer 4, the light-emitting layer 5 and electron transport layer 6 are provided between the positive electrode 3 and the negative electrode 7 so as to be laminated in this order from the positive electrode 3 side.

The hole transport layer 4 has a function that transports holes injected from the positive electrode 3 to the light-emitting layer 5.

The material constituting the hole transport layer 4 (hole transport material) may include, for example, polyarylamine, fluorine-arylamine copolymer, fluorine-bithiophene copolymer, poly(N-vinylcarbazole), polyvinylpyrene, polyvinylanthracene, polythiophene, polyalkylthiophene, polyhexyl thiophene, poly(p-phenylenevinylene), polyphenylenevinylene, pyreneformaldehyde resin, ethylcarbazoleformaldehyde resin or derivative thereof, and one kind or at least two kinds can be combined.

The average thickness of the hole transport layer 4 is not limited, but preferably in the range of 10 to 150 nm and more preferably in the range of 50 to 100 nm.

The electron transport layer 6 has a function that transports electrons injected from the negative electrode 7 to the light-emitting layer 5.

The material constituting the electron transport layer 4 (electron transport material) may include, for example, benzene compound such as 1,3,5-tris[(3-phenyl-6-trifluoromethyl)quinoxaline-2-yl]benzene (TPQ1) and 1,3,5-tris[{3-(4-t-butylphenyl)-6-trisfluoromethyl}quinoxaline-2-yl] benzene (TPQ2), naphthalene compound, phenanthrene compound, chrysene compound, perylene compound, antharacene compound, pyrene compound, acridine compound, stilbene compound, thiophene compound such as BBOT, butadiene compound, coumalin compound, quinoline compound, distyryl compound, pirazine compound such as distyrylpirazine, quinoxaline compound, benzoquinone compound such as 2,5-diphenyl-para-benzoquinone, naphthoquinone compound, anthraquinone compound, oxadiazole compound such as 2-(4-Biphenylyl)-5-(4-t-butylphenyl)-1,3, 4-oxadiazole (PBD), triazole compound such as 3,4,5-triphenyl-1,2,4-triazole, oxazole compound, anthrone compound, fluorenone compound such as 1,3,8-trinitrofluorenone (TNF), diphenoquinone compound such as MBDQ, stilbenquinone compound such as MBSQ, anthraquinodimethane compound, thiopyrandioxide compound, fluorenylidenemethane compound, diphenyldicyanoethylene compound, fluorene compound, 8-hydroxyquinoline-aluminum ($Alq_3$), various metal complexes such as complex having benzoxazole or benzothiazole as a ligand, and one type or at least two types in combination of them can be used.

The average thickness of the electron transport layer 6 is not limited, but preferably in the range of 1 to 100 nm and more preferably in the range of 20 to 50 nm.

When the voltage is applied between the positive electrode 3 and the negative electrode 7, holes move in the hole transport layer 4 and electrons move in the electron transport layer. The holes and electrons are recombined in tie light-emitting layer 5. In the light-emitting layer 5, excitons are produced by an energy discharged upon the recombination, and energy (fluorescent light or phosphorescent light) is discharged (emitted) when the excitons are returned to the ground state.

The material constituting the light-emitting layer 5 (light-emitting material) may be any materials provided that upon applying voltage, holes can be injected from the positive electrode 3 and electrons can be injected from the negative electrode 7, and locations can be provided where the holes and electrons are recombined.

In particular, the light-emitting material may include benzene compound such as 1,3,5-tris[(3-phenyl-6-trifluoromethyl)quinoxaline-2-yl]benzene (TPQ1) and 1,3,5-tris[{3-(4-t-butylphenyl)-6-trisfluoromethyl}quinoxaline-2-yl] benzene (TPQ2), metal or metal-free phthalocyanine compound such as phthalocyanine, copper phthalocyanine (CuPc), and iron phthalocyanine, low-molecular compound such as tris(8-hydroxyquinolinolate)aluminum ($Alq_3$), fac-tris(2-phenylpyridine) iridium ($Ir(ppy)_3$), or high-molecular compound such as oxadiazole polymer, triazole polymer, and carbazole polymer, and one type or at least two types in combination is used to obtain the aimed emission color.

The light-emitting layer may be a single-layered structure or a laminate, comprising one type or at least two types of such light-emitting materials.

The average thickness of the light-emitting layer 6 is not particularly limited, but preferably in the range of 10 to 150 nm and more preferably in the range of 50 to 100 nm.

In addition to the hole transport layer 4, the light-emitting layer 5 and electron transport layer 6, any other objective layer may be provided between the positive electrode 3 and the negative electrode 7.

For example, a hole injection layer that improves efficiency for injecting holes from the positive electrode 3 to the hole transport layer 4 may be provided between the positive electrode 3 and the hole transport layer 4. An electron injection layer that improves efficiency for injecting electrons from the negative electrode 7 to the electron transport layer 6 may be provided between the negative electrode 7 and the electron transport layer 6.

The material constituting the hole injection layer (hole injection material) may include, for example, copper phthalocyanine or 4,4',4"-tris(N,N-phenyl-3-methylphenylamino) triphenylamine (m-MTDATA), etc.

The material constituting the electron injection layer (electron injection material) may include, for example, 8-hydroxyquinoline, oxadiazole, and derivative thereof (for example, metallic chelate oxinoid compound containing 8-hydroxyquinoline) or alkali metal halide such as LiF, KF, LiCl, KCl, NaCl, and one kind or a combination of at least two kinds can be used.

The sealing member 8 is provided opposite to the transparent substrate 2. The sealing member 8 has a recess 81, and each organic EL element 1 having above-described constitution is accommodated in the recess 81.

The sealing member 8 has a function that seals the each layer 3, 4, 5, 6, 7 provided in the organic EL element 1 in airtight manner to block oxygen or moisture. By providing the sealing member 8, the reliability of the display device 10 can be improved and the deterioration of the display device can be prevented.

The material constituting the sealing member may include, for example, soda glass, crystalline glass, quartz glass, lead glass, etc.

The sealing member 8 and the transparent substrate 2 is bonded at an edge of the transparent substrate 2 via an adhesive layer (not shown).

Examples of a material constituting the adhesive layer include thermosetting resins such as epoxy resins, acryl resins and acryl-epoxy resins.

As a method of air-tightly sealing the layers 3, 4, 5, 6 and 7 constituting the organic EL elements 1, in addition to the method of providing the sealing member 8, a method of contacting and forming a protective layer on the layers (the hole transport layer 6 and the negative electrode 7 in the present embodiment) exposed on the transparent substrate 2 may be used. With the use of the method of forming the protective layer, it is possible to further decrease the thickness of the light-emitting device 10.

Examples of a material constituting the protective layer include nitride-oxide silicon, dioxide silicon and various resin materials.

The display device 10 can be manufactured through the following processes, for example.

1D

First, a transparent substrate 2 is prepared.

2D

Next, a plurality of positive electrodes 3 is formed on the transparent substrate 2 in a linear form.

The positive electrodes 3 can be obtained by forming a conductive film mainly constituted by the constituent material of the positive electrode 3 described above by using a vapor deposition method such as a vacuum deposition method or a sputtering method and patterning the conductive film using a photolithographic method.

3D

Next, a hole transport layer 4 is formed on the transparent substrate 2 exposed between the positive electrodes 3.

The hole transport layer 4 may be formed using a vapor process such as using a sputtering method, a vacuum deposition method or a CVD method or a liquid process such as using a spin coat method (a pyrosol method), a barcode method, a roll coat method, a spray coat method, a screen print method, an offset print method, an inkjet print method. Among these methods, it is desirable to form the hole transport layer 4 using the vapor process. When the hole transport layer 4 is formed using the vapor process, it is possible to securely prevent or reduce the intrusion of moisture into the hole transport layer 4. As a result, temporal deterioration in the characteristics of the organic EL element 1 is securely prevented or suppressed.

4D

Next, a plurality of light-emitting layers 5 is formed on the hole transport layer 4 in a matrix so that the light-emitting layer 5 is disposed at the intersection of the positive electrodes 3 and the negative electrodes 7 to be formed in a process 6D described later.

Although the light-emitting layer 5 may be formed using the vapor process or the liquid process, it is desirable to form the light-emitting layer 5 using vapor process due to the same reason as described above.

The light-emitting layer 5 can be easily patterned by performing the vapor process in the state where a mask with an opening having a shape conforming to the light-emitting layer 5, i.e., a mask with an opening having a matrix shape is mounted on the transparent substrate 2 including the positive electrode 3 and the hole transport layer 4.

Since the layers 3, 4 and 5 are not exposed to an aqueous solvent when the light-emitting layer 5 is patterned using the afore-mentioned method, it is possible to securely prevent alteration or deterioration of the layers 3, 4 and 5.

5D

Next, an electron transport layer 6 is formed on the hole transport layer 4 exposed between the light-emitting layers 5.

Although the electron transport layer 6 may be formed using the vapor process or the liquid process, it is desirable to form the electron transport layer 6 using vapor process due to the same reason as described above.

6D

Next, a plurality of negative electrodes 7 are formed on the electron transport layer 6 in a linear form so as to intersect the positive electrodes 3 so that the regions of the negative electrodes 7 intersecting the positive electrodes 3 correspond to the region where the light-emitting layer 5 is formed.

The negative electrodes 7 are formed using the above-mentioned film forming method of the invention. Accordingly, it is possible to form the negative electrodes 7 in which warping or twisting is securely suppressed.

In addition, since a plurality of negative electrodes 7 having a small width are formed in a bundle using a vapor deposition method at a time when the negative electrodes 7 are formed using the film forming method of the invention, it is possible to reduce the number of performing the vapor deposition method, i.e., manufacturing process, and to reduce manufacturing cost. Since the mask 40 can be positioned using the mask positioning mark 46 at a time, it is possible to improve the positioning (alignment) accuracy of the negative electrodes 7.

In addition, in the case of the present embodiment where metal wires (linear member) such as the negative electrodes 7 are formed on an organic layer such as the electron transport layer 6, it is desirable to use a vacuum deposition method as the vapor deposition method used in the film forming method of the invention. In the vacuum deposition method, it is possible to coat the organic layer with the materials (film materials) constituting the metal wires at a relatively low speed and suitably prevent or suppress the alteration or deterioration of the organic layer at the time of coating with the film materials. When it is desired to reduce the metal layer forming time, an underlying layer is formed on a region contacting the organic layer using a vacuum deposition method and an upper layer is formed on the underlying layer using a sputtering method.

When the mask 40 is mounted on the transparent substrate 2 having the layers 3, 4, 5 and 6, it is desirable to position the reinforcement beam 44 of the mask 40 at a position that does not correspond to the previously formed positive electrodes 3. Accordingly, it is possible to securely prevent the formation of the thin film portion at a position where the negative electrodes 7 intersect the positive electrodes 3 even when a thin film portion is formed at a position corresponding to the reinforcement beam 44 of the negative electrodes 7 (the linear member). Accordingly, it is possible to suitably prevent or suppress alteration or deterioration of the layers 3, 4, 5 and 6 even when the negative electrodes 7 are heated due to increase in resistance of the thin film portion.

In addition, in the film forming method of the invention, since the negative electrodes 7 are formed using a vapor deposition method with the use of a mask (a shadow mask), it is possible to eliminate formation of the partition wall for defining the shape of the negative electrodes 7 on the transparent substrate 2. Accordingly, it is possible to simplify manufacturing process and decrease the thickness of the light-emitting device 10.

With this arrangement, a plurality of organic EL elements 1 is formed on the transparent substrate 2.

7D

Next, a sealing member 8 having a concave portion 81 is prepared.

Then, the transparent substrate 2 and the sealing member 8 are attached to each other at the periphery of the transparent substrate 2 through an adhesive layer in the state where the sealing member 8 is disposed opposite to the transparent substrate 2 so that each of the organic EL elements 1 is received by the concave portion 81.

With this arrangement, the organic EL elements 1 are sealed by the sealing member 8 and the display device 10 is manufactured.

Electronic Apparatus

The display device 10 can be mounted on various types of electronic apparatuses.

Figure 10:
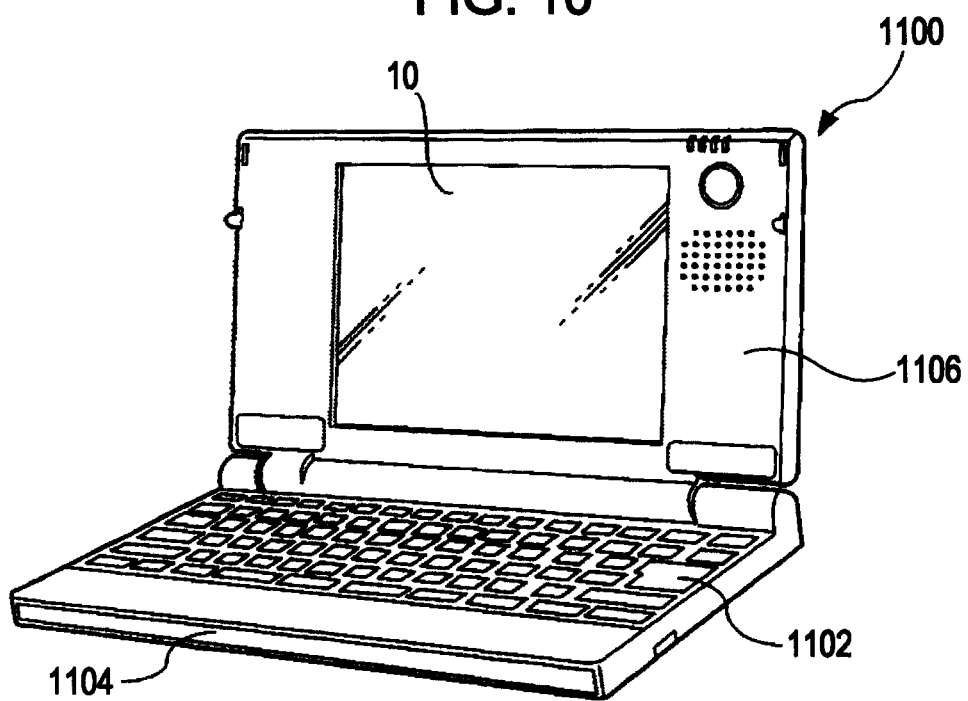
FIG. 10 is a perspective view illustrating a configuration of a mobile (or notebook type) personal computer employing an electronic apparatus according to an embodiment of the invention.

FIG. 10 is a schematic view showing the construction of a mobile (or notebook) personal computer to which an electronic apparatus of the invention is applied.

In FIG. 10, the personal computer 1100 is constituted by a main body 1104 having a keyboard 1102 and a display unit 1106 having a display unit, and the display unit 1106 is rotatably supported on the main body 1104 through a hinge.

In the personal computer 1100, the display unit of the display unit 1106 is constructed by the above-mentioned display device 10.

Figure 11:
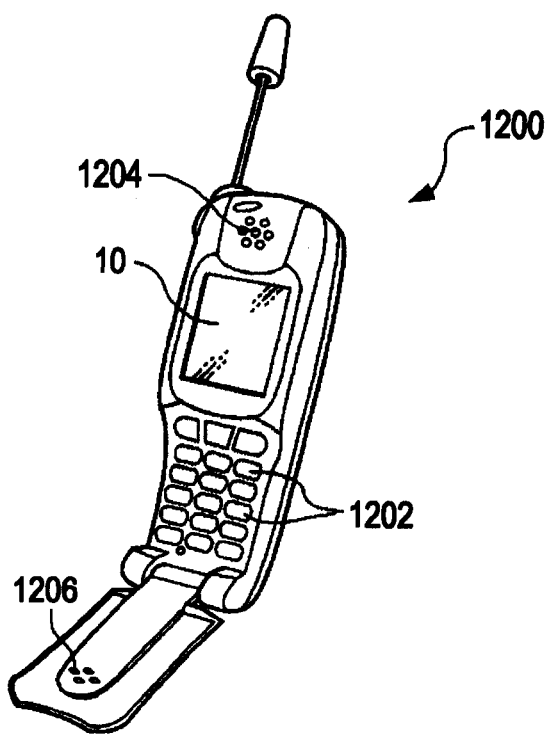
FIG. 11 is a perspective view illustrating a configuration of a mobile phone (including a PHS) employing the electronic apparatus according to an embodiment of the invention.

FIG. 11 is a schematic view showing the construction of a portable phone (including a PHS) to which the electronic apparatus of the invention is applied.

In FIG. 11, the portable phone 1200 includes a display unit, a plurality of operation buttons 1202, an ear piece 1204 and a mouthpiece 1206.

In the portable phone 1200, the display unit is constructed by the above-mentioned display device 10.

Figure 12:
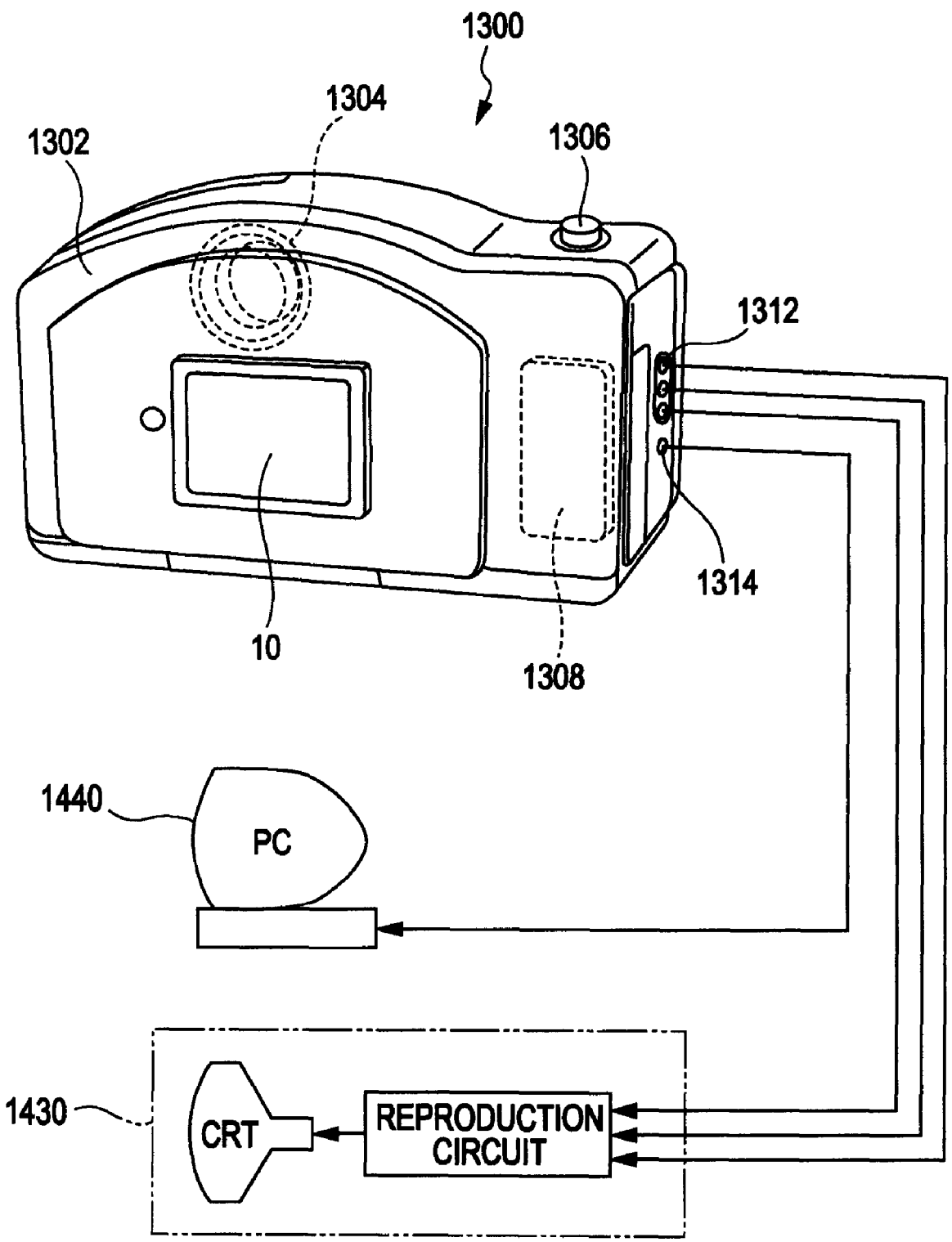
FIG. 12 is a perspective view illustrating a configuration of a digital still camera employing the electronic apparatus according to an embodiment of the invention.

FIG. 12 is a schematic view showing the structure of a digital still camera to which the electronic apparatus of the invention is applied.

FIG. 12 also shows the connection with the external apparatus in a simplified manner.

In a general camera, a silver halide photographic film is exposed to light by an optical image of an object.

On the contrary, in the digital still camera 1300, the optical image of the object is converted into a pickup signal (an image signal) through a photoelectric conversion by an image pickup device such as a charge coupled device (CCD).

In the digital still camera 1300, the display unit is formed on the backside of a case (body) 1302. The display unit displays images on the basis of the pickup signal from the CCD and serves as a finder which displays the object as an electronic image.

In the digital still camera 1300, the display unit is constructed by the above-mentioned display device 10.

A circuit board 1308 is incorporated in the inner side of the case. The circuit board 1308 includes a memory capable of storing (memorizing) the pickup signal.

A light receiving unit 1304 including an optical lens (pickup optical system) or CCD is formed on the front side (the rear surface in the drawing) of the case 1302.

When an operator presses a shutter button 1306 while observing the image of the object displayed on the display unit, the pickup signal from the CCD at that moment is sent and stored to the memory of the circuit board 1308.

In the digital still camera 1300, a video signal output terminal 1312 and an input/output terminal 1314 for data communication are disposed on the side of the case 1302. As shown in the figure, the video signal output terminal 1312 and the input/output terminal 1314 for data communication are connected respectively to a TV monitor 1430 and a personal computer 1440, according to need. Alternatively, the pickup signal stored in the memory of the circuit board may be output to the TV monitor 1430 or the personal computer 1440 through a predetermined operation.

In addition to the personal computer (mobile personal computer) shown in FIG. 10, the portable phone shown in FIG. 11 and the digital still camera shown in FIG. 12, the electronic apparatus of the invention may be applied to a television, a video camera, a view finder type or direct monitor view type video tape recorder, a laptop type personal computer, a car navigation apparatus, a pager, an electronic pocketbook (may include a communication function), an electronic dictionary, an electronic calculator, an electronic game machine, a word processor, a workstation, a video phone, a TV monitor for crime prevention, an electronic binocular, a POS terminal, a touch panel-equipped apparatus (for example, a cash dispenser in a financial institution, an automatic ticket vending machine), a medical apparatus (for example, an electronic thermometer, a blood pressure meter, a blood sugar meter, an electrocardiography display, an ultrasonic diagnostic equipment, an endoscope display), a fish finder, various measurement apparatus, meters (for example, meters of vehicles, airplanes and vessels), a flight simulator, other various monitors, and a projection type display such as a projector.

Although a mask, a film forming method, a light-emitting device and an electronic apparatus of the invention has been described with reference to the embodiment shown in drawings, the invention is not limited to these embodiments.

One or two additional process for an arbitrary purpose may be added to the film forming method of the invention.

The film forming method according to the invention may be applied not only to the method of forming the negative electrodes constituting the passive matrix type display device but also to the method of forming the metal wires constituting the circuit board.

EXAMPLES

Hereinafter, specific examples of the invention will be described.

1. Formation of Mask

First, mask (A) and mask (B) were prepared as described below.

Mask (A)

1A

First, a mono-crystalline silicon substrate having a thickness of 0.400 mm was prepared and left in steam of 1050° C. thereby forming a silicon dioxide film having a thickness of 1 μm on a outer surface of the substrate.

2A

Next, as shown in FIGS. 4A and 5A, a resist layer according to the shape of a formed opening was formed by using photolithography and then the dioxide film formed on the opening of the resist layer was removed by fluorine buffer solution thereby exposing the surface of the mono-crystalline silicon substrate.

3A

Next, as shown in FIGS. 4B and 5B, the resist layer was formed in a region forming a reinforcement beam among the regions forming the opening by using photolithography.

4A

Next, as shown in FIGS. 4C and 5C, the mono-crystalline silicon substrate in a region not forming the reinforcement beam among the regions forming the opening was uniformly removed to the predetermined depth by using dry etching apparatus.

5A

Next, as shown in FIGS. 4D and 5D, the resist layer was removed by oxygen plasma ashing under the atmospheric pressure, thereby exposing the surface of the mono-crystalline silicon substrate in the region forming the opening.

6A

Next, in the same manner as process 4A as shown in FIGS. 4E and 5E, the mono-crystalline silicon substrate in the region forming the opening was uniformly removed to the predetermined depth by using dry etching apparatus.

7A

Next, as shown in FIGS. 4F and 5F, the dioxide film formed on the outer surface of the mono-crystalline silicon substrate was removed again by using the fluorine buffering solution thereby forming a dioxide silicon film on the entire outer surface of the mono-crystalline silicon substrate in the same manner as the process 1A.

8A

Next, in the same manner as the process 2A as shown in FIGS. 4G and 5G, the dioxide silicon film of the mono-crystalline silicon substrate formed on the opposing surface in which the processes 2A to 6A were performed was removed except the outer peripheral portion of the mono-crystalline silicon substrate.

9A

Next, as shown in FIGS. 4H and 5H, the mono-crystalline silicon substrate exposed from the dioxide silicon film was uniformly removed to the predetermined depth in a thickness direction of the mono-crystalline by wet etching which uses KOH as an etching solution.

10A

Next, as shown in FIGS. 4I and 5I, the dioxide silicon film formed on the outer surface of the mono-crystalline silicon substrate was removed by fluorine buffer solution.

According to the abovementioned process, the mask (A) having the opening (length of 40 mm and width of 100 μm) and the reinforcement beam of which width p is 50 μm and the distance r from the surface mounting the substrate is 100 μm is formed.

Mask (B)

Mask (B) in which the formation of the reinforcement beam was omitted was formed in the same manner as the process of formation of the mask (A) except that the processes 3A to 5A were omitted.

2. Formation and Evaluation of Linear Member

Example 1

1B

First, the mask (A) was mounted on a quartz glass substrate and then the quartz glass having the mask (A) was set on a substrate holder in a chamber.

Then, Al was set in a crucible as a film material.

At this time, the distance A between a rotation axis of the substrate holder and a central axis of the crucible was set to 10.0 cm and the distance B between the mask (A) and the opening of the crucible was set to 20.0 cm.

2B

Next, an exhaust pump was operated so that the pressure within the chamber was set to $1 \times 10^{-3}$ Pa.

3B

Next, the rotation axis of the substrate holder was rotated so that the quartz glass substrate (mask (A)) rotated at 10 rpm.

4B

Next, while rotating the quartz glass substrate, the crucible was heated to 1200° C. and the Al was evaporated so that the linear member having an average thickness of 150 nm and using Al as a main material was formed on the quartz glass substrate.

Example 2

In the process 1B, a linear member was formed on a quartz glass substrate in the same manner as Example 1 except that the distance A between the rotation axis of the substrate holder was set to 6.5 cm and the distance B between the mask (A) and the opening of the crucible was set to 10.0 cm.

Comparative Example

In the process 1B, the linear film members were formed on a quartz glass substrate in the same manner as Example 1 except that the mask (B) instead of the mask (A) was mounted on the quartz glass substrate.

The shapes of the linear film members formed by the embodiments and comparative example were examined using scanning electron microscope (SEM).

As a result, in the examples, the linear film members were formed with an approximately uniform thickness. In the comparative example, twist was generated in the linear film members and the linear film members had a non-uniform thickness.

What is claimed is:

1. A mask which is used to form on a surface of a substrate a plurality of linear film members disposed parallel to each other by fixing one surface of the mask to the substrate and supplying a film material through the other surface of the mask by the use of a vapor process, the mask comprising:

a mask body having a plurality of partition walls in which a plurality of openings are disposed, the plurality of openings corresponding to patterns of the linear film members; and reinforcement ribs which are disposed so as to cross within the partition walls and the openings and which are configured to prevent deformation of the mask body due to the weight thereof, wherein the reinforcement ribs are disposed close to the other surface of the mask in the thickness direction of the openings, and wherein each of the openings has an enlarged width portion in the middle portion in the longitudinal direction, and wherein the reinforcement ribs are disposed in the enlarged width portions.

2. The mask according to claim 1, wherein the mask body and the reinforcement ribs are formed in a body.

3. The mask according to claim 2, wherein the mask is formed of silicon as a major component.

4. The mask according to claim 3, wherein a metal layer is formed on the one surface of the mask.

5. The mask according to claim 4, wherein the metal layer is formed using an electroless plating method.

6. The mask according to claim 4, wherein the metal layer is formed of at least one of cobalt, iron, and nickel as a major component.

7. The mask according to claim 1, wherein the reinforcement ribs are disposed in the longitudinal direction of the openings at an almost constant interval.

8. The mask according to claim 1, wherein each of the reinforcement ribs has an almost constant width from the one surface of the mask to the other surface of the mask.

9. The mask according to claim 1, wherein each of the reinforcement ribs has a portion of which the width increases from the one surface of the mask to the other surface of the mask.

10. A film forming method comprising:

mounting the mask according to claim 1 on the substrate which is disposed opposite to a film material source for supplying the film material and which is held by a substrate holder disposed so as to be rotatable; and forming the linear film members by displacing the substrate at least once between a first position where the distance between the film material source and the substrate is largest and a second position which is symmetric to the first position about a rotation axis of the substrate holder and allowing the film material supplied from the film material source to pass through the openings, wherein when the distance between the rotation axis of the substrate holder and the film material source is A cm, the distance between the mask and the opening of the film material source is B cm, the largest length of the reinforcement beam in the longitudinal direction of the openings is p pm, and the distance between the substrate and the reinforcement ribs is r μm, a relation of $p/r < 2A/B$ is satisfied.

11. The film forming method according to claim 10, wherein the displacement of the substrate between the first position and the second position is performed by allowing the substrate holder to rotate.

12. The film forming method according to claim 11, wherein the rotation of the substrate is performed continuously or intermittently.

13. A light-emitting device having the linear film members formed using the film forming method according to claim 10.

14. The light-emitting device according to claim 13, wherein the linear film members are negative electrodes.

15. An electronic apparatus comprising the light-emitting device according to claim 13.

* * * * *